USOO8674860B2

(12) United States Patent
Wu

(10) Patent No.: US 8,674,860 B2
(45) Date of Patent: *Mar. 18, 2014

(54) COMBINED WU AND CHASE DECODING OF CYCLIC CODES

(75) Inventor: Yingquan Wu, Palo Alto, CA (US)

(73) Assignee: LSI Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/547,463

(22) Filed: Jul. 12, 2012

(65) Prior Publication Data

US 2014/0015697 A1 Jan. 16, 2014

(51) Int. Cl.
*H03M 7/00* (2006.01)
(52) U.S. Cl.
USPC .......................................... 341/107; 714/780
(58) Field of Classification Search
USPC .................. 341/107; 714/718, 792, 786, 746;
375/341, 265, 261
See application file for complete search history.

(56) References Cited

U.S. PATENT DOCUMENTS

| 7,793,195 B1 | 9/2010 | Wu ................................ 714/781 |
| 2009/0158128 A1* | 6/2009 | Yokokawa et al. ........... 714/780 |

OTHER PUBLICATIONS

Ali, Mortuza, et al., "An Algebraic Approach to Source Coding with Side Information Using List Decoding", Cornell University Library, arXiv.org arXiv:1110.6698v1 [cs.IT], Oct. 31, 2011, pp. 1-14.

Santhi, Nandakishore, On Algebraic Decoding of q-ary Reed-Muller and Product Reed-Solomon Codes, Cornell University Library, arXiv.org arXiv:0704.2811v1 [cs.IT], Apr. 22, 2007, 5 pages.
Barbier, M., New Set of Codes for the Maximum-Likelihood Decoding Problem, Cornell University Library, arXiv.org,, arXiv:1011.2834v1 [cs.IT], Nov. 12, 2010, pp. 1-5.
Chase, David, A Class of Algorithms for Decoding Block codes With Channel Measurement Information, IEEE Transactions on Information Theory, vol. IT-18, No. 1, Jan. 1972, pp. 170-182.
Koetter, Ralf, et al., "Algebraic Soft-Decision Decoding of Reed-Solomon Codes", IEEE Transactions on Information Theory, vol. 49, No. 11, Nov. 2003, pp. 2809-2825.
Nguyen, Phong S, et al., "On Multiple Decoding Attempts for Reed-Solomon Codes: A Rate-Distortion Approach", IEEE Transactions on Information Theory, vol. 57, No. 2, Feb. 2011, pp. 668-691.
Wu, Yingquan, "New List Decoding Algorithms for Reed-Solomon and BCH Codes", IEEE Transactions on Information Theory, vol. 54, No. 8, Aug. 2008, pp. 3611-3630.

* cited by examiner

*Primary Examiner* — Joseph Lauture
(74) *Attorney, Agent, or Firm* — Christopher P. Maiorana, PC

(57) ABSTRACT

An apparatus having a first circuit and a second circuit is disclosed. The first circuit may be configured to generate (i) a plurality of symbols and (ii) a plurality of decision values both in response to detecting an encoded codeword. The second circuit may be configured to (i) generate a plurality of probabilities to flip one or more of the symbols based on the decision values, (ii) generate a modified probability by merging two or more of the probabilities of an unreliable position in the symbols and (iii) generate a decoded codeword by decoding the symbols using a list decode technique in response to the modified probability.

20 Claims, 10 Drawing Sheets

COMBINED WU AND CHASE DECODING OF CYCLIC CODES

FIELD OF THE INVENTION

The present invention relates to decoding cyclic codes generally and, more particularly, to a method and/or apparatus for implementing a combined Wu and Chase decoding of cyclic codes.

BACKGROUND OF THE INVENTION

Efficient list decoding beyond half a minimum distance for Reed-Solomon and Bose, Ray-Chaudhuri and Hocquenghem (i.e., BCH) codes were first devised in 1997 and later improved almost three decades after the inauguration of an efficient hard-decision decoding method. In particular, for a given Reed-Solomon code C(n,k,d), a Guruswami-Sudan decoding method corrects up to $n-\sqrt{n(n-d)}$ errors, which effectively achieves a Johnson bound, a general lower bound on the number of errors to be corrected under a polynomial time for any code. Schmidt, Sidorenko, and Bossert devised a multi-sequence shift-register synthesis to find an error locator polynomial beyond half a minimum distance for low-rate (i.e., <1/3) Reed-Solomon codes when a unique solution exists. Apart from small probability of failure due to ambiguity, the resulting decoding radius is identical to that of the Sudan technique. The Sudan technique extended the Guruswami-Sudan technique to achieve subfield Johnson bounds for subfield subcodes of Reed-Solomon codes by distributing multiplicities across the entire subfield.

Wu presented a list decoding technique for Reed-Solomon and binary BCH codes. The Wu list decoding technique casts a list decoding as a rational curve fitting problem utilizing polynomials constructed by a Berlekamp-Massey technique. The Wu technique achieves the Johnson bound for both Reed-Solomon and binary BCH codes. Beelen and Hoeholdt re-interpreted the Wu list decoding technique in terms of Gröbner bases and an extended Euclidean technique to list decoded binary Goppa codes up to the binary Johnson bound.

It would be desirable to implement a combined Wu and Chase decoding of cyclic codes.

SUMMARY OF THE INVENTION

The present invention concerns an apparatus having a first circuit and a second circuit. The first circuit may be configured to generate (i) a plurality of symbols and (ii) a plurality of decision values both in response to detecting an encoded codeword. The second circuit may be configured to (i) generate a plurality of probabilities to flip one or more of the symbols based on the decision values, (ii) generate a modified probability by merging two or more of the probabilities of an unreliable position in the symbols and (iii) generate a decoded codeword by decoding the symbols using a list decode technique in response to the modified probability.

The objects, features and advantages of the present invention include providing a combined Wu and Chase decoding of cyclic codes that may (i) merge two or more most reliable flipping estimations of an unreliable position into a single estimation, (ii) add two probabilities prior to base multiplicity adjustments, (iii) combine Chase decoding with Wu list decoding, (iv) decode BCH codewords and/or (v) decode Reed-Solomon codewords.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally concern scenarios where a fraction of positions of a received word are pre-corrected. Accordingly, a Wu list decoding technique may avoid interpolating the pre-corrected positions and thus effectively increases a list error correction capability (e.g., LECC). List decoding generally generates a list of possibilities for a received codeword, a single possibility being correct. For a Reed-Solomon code C(n,k,d), a parameter n* may be an effective code length by neglecting known locations. Therefore, a resulting LECC may be $n^*-\sqrt{n^*(n^*-d)}$ and independent of an actual code length n. When n* reduces toward d, the LECC generally approaches to d−1. For a binary BCH/Goppa code C(n,k,d), the parameter n* may be the effective code length by neglecting known locations. Hence, a resulting LECC may be $$\frac{1}{2}\left(n^* - \sqrt{n^*(n^* - 2d)}\right)$$

and independent of the actual code length n. When n* reduces toward 2d, the LECC generally approaches to d−1. In particular, the lists may include all (e.g., up to $2d^2+2$) codewords among any 2d−1 erasure bits. The codewords may be generated by applying the list decoding technique twice, an application with the given 2d−1 bits and another application with all flipped 2d−1 bits. The Wu list decoding technique may be transformed into an algebraic soft-decision decoding technique by translating symbol error probability information into an appropriate multiplicity vector. A combination of Chase decoding and the transformed Wu list decoding technique may be utilized.

Simulation results generally indicate that some embodiments of the present invention may achieve gains over hard-decision decoding at a practically implementable complexity. For instance, a (255, 191) Reed-Solomon code under a quadrature amplitude module (e.g., QAM), with a low cost value (e.g., C) of 300, in combination with a Chase-16 decoding generally achieves a 0.9 dB gain over the hard-decision decoding. In another example, a (4408, 4096) Bose, Ray-Chaudhuri and Hocquenghem (e.g., BCH) code under a binary phase-shift keying (e.g., BPSK) modulation, with a low cost value of 300 (which may be less than the redundant length), in combination with Chase-8 decoding may achieve a 0.55 dB improvement over the hard-decision decoding.

Figure 1:
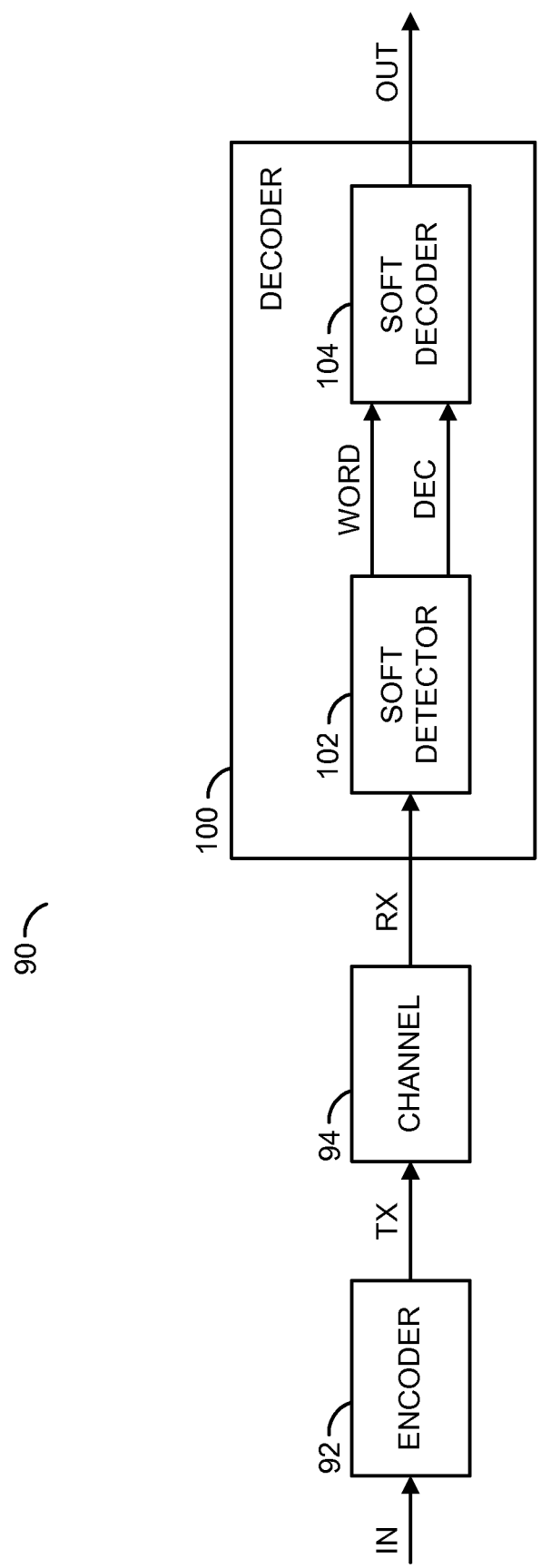
FIG. 1 is a block diagram of a communication system.

Referring to FIG. 1, a block diagram of a communication system (or apparatus) 90 is shown. The system 90 generally comprises a block (or circuit) 92, a block (or circuit) 94 and a block (or circuit) 100. The circuit 100 generally comprises a block (or circuit) 102 and a block (or circuit) 104. The circuits 92 to 104 may represent modules and/or blocks that may be implemented as hardware, software, a combination of hardware and software, or other implementations.

A signal (e.g., IN) may be received by the circuit 92. The signal IN may implement an input signal carrying codewords (or words or symbols or bits) to be encoded and transferred/stored. The circuit 92 may generate a signal (e.g., TX) received by the circuit 94. The signal TX may implement a transmit signal that conveys the encoded codewords from the signal IN. A signal (e.g., RX) may be generated by the circuit 94 and received by the circuit 100/102. The signal RX may implement a received signal. In the absence of errors, the codewords in the signal RX may match the codewords in the signal TX. The circuit 102 may generate a signal (e.g., WORD) received by the circuit 104. The signal WORD may carry a received codeword (or bits or symbols) detected in the signal RX. A signal (e.g., DEC) may also be generated by the circuit 102 and received by the circuit 104. The signal DEC may convey decisions about the received codewords in the signal RX. A signal (e.g., OUT) may be generated by the circuit 100/104. The signal OUT may implement an output signal that contains the decoded codeword (or word or symbols or bits).

The circuit 92 may implement an encoder circuit. The circuit 92 is generally operational to encode the codewords received in the signal IN. The encoding may be a cyclic code encoding, a BCH encoding or a Reed-Solomon encoding. The encoded codewords may be presented in the signal TX.

The circuit 94 may implement a communication channel. The circuit 94 is generally operational to carry the encoded codewords communicated from the circuit 92 to the circuit 100. The circuit 94 may also carry data communicated from the circuit 100 to the circuit 92. Implementations of the circuit 94 may include, but are not limited to, one or more transmission media such as air, wire, optical fibre, Ethernet and the like. In some embodiments of the present invention, the circuit 94 may implement a storage medium. Storage media may include, but is not limited to, optical media, magnetic media and electronic media.

The circuit 100 may implement a receiver circuit. The circuit 100 is generally operational to decode the encoded codewords received in the signal RX. The decoding may include a soft detection and a soft decode. The received and decoded codewords may be presented in the signal OUT.

The circuit 102 may implement a soft detector circuit. The circuit 102 is generally operational to detect the codewords received in the signal RX using a soft decision and/or a hard decision. The detected codewords may be presented in the signal WORD. Decision values corresponding to the detected codewords may be presented in the signal DEC.

The circuit 104 may implement a soft decoder circuit. The circuit 104 is generally operational to decode the codewords received in the signal WORD based on the decision values received in the signal DEC. The soft decoding may include, but is not limited to, (i) generating a plurality of probabilities to flip one or more of the symbols within the codewords based on said decision values, (ii) generating a modified probability by merging two or more of the probabilities of an unreliable position in the symbols and (iii) generating the decoded codeword by decoding the symbols using a list decode technique in response to the modified probability. In some embodiments, the probabilities may be generated using the Chase technique. The list decode technique generally comprises the Wu list decode technique. The encoded codewords may comprise Reed-Solomon codewords or BCH codewords.

Figure 2:
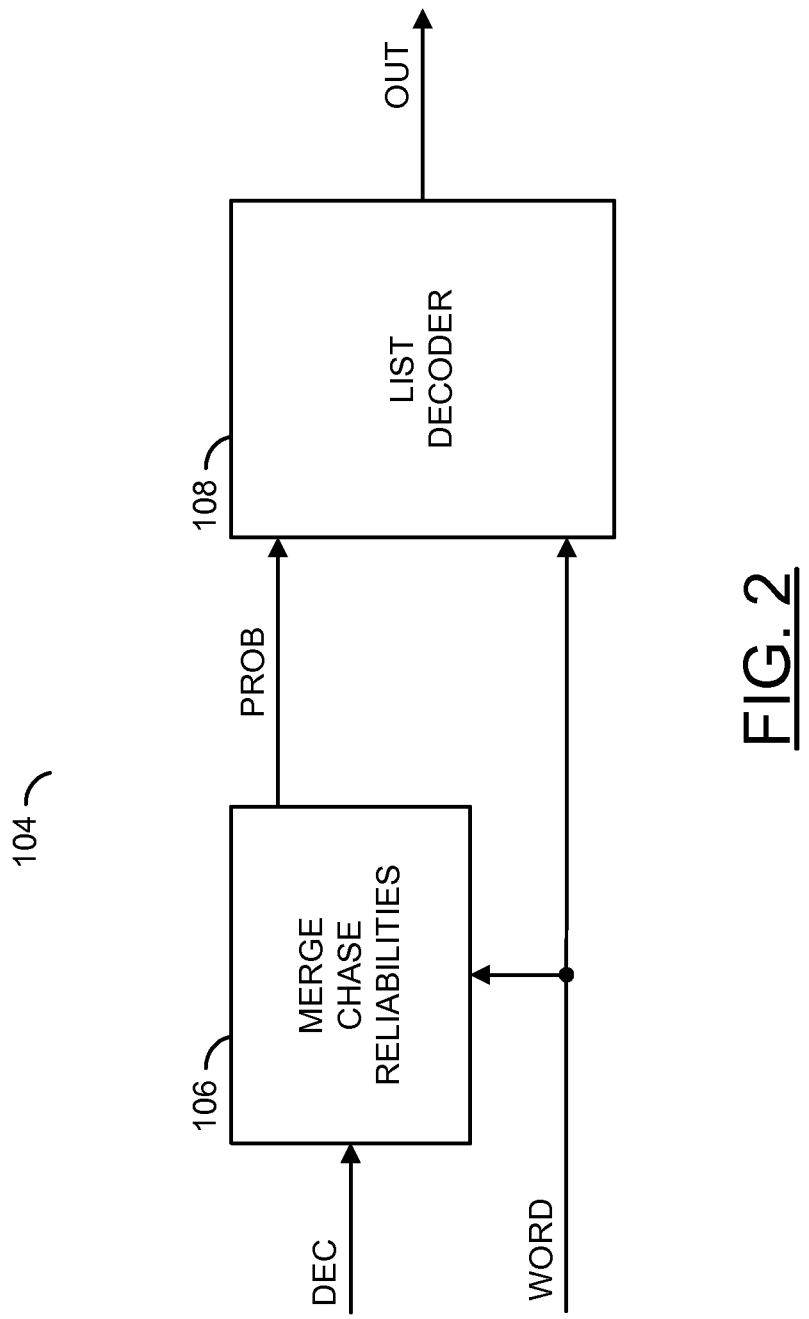
FIG. 2 is a block diagram of an example implementation of a soft decoder circuit in accordance with a preferred embodiment of the present invention.

Referring to FIG. 2, a block diagram of an example implementation of the circuit 104 is shown in accordance with a preferred embodiment of the present invention. The circuit 104 generally comprises a block (or circuit) 106 and a block (or circuit) 108. The circuits 106 to 108 may represent modules and/or blocks that may be implemented as hardware, software, a combination of hardware and software, or other implementations.

The signal DEC may be received by the circuit 106. The signal WORD may be received by the circuits 106 and 108. A signal (e.g., PROD) may be generated by the circuit 106 and presented to the circuit 108. The signal PROD generally conveys probability values for flipping bits or symbols in the received codewords in the signal WORD. The signal OUT may be generated by the circuit 108.

The circuit 106 may implement a merge circuit. The circuit 106 is generally operational to generate the probabilities to flip one or more of the symbols/bits in the codewords based on the decision values in the signal DEC. The circuit 106 may also be operational to generate a modified probability by merging two or more of the probabilities of an unreliable position in the symbols/bits. In some embodiments, the merging may merge Chase reliabilities created by the Chase technique. The Chase technique is generally described in the paper, "A class of algorithms for decoding block codes with channel measurement information", IEEE Trans. Inform. Theory, vol. 18, pp. 170-182, January 1972, which is hereby incorporated by reference in its entirety. The merged reliabilities may be presented as a merged matrix in the signal PROB.

The circuit 108 may implement a list decoder circuit. The circuit 108 is generally operational to generate the decoded codewords by decoding the symbols/bits using a list decode technique in response to the modified probability. In some embodiments, the list decode technique may be the Wu list decode technique. The Wu list decoding technique is generally described in a paper "New list decoding algorithms for Reed-Solomon and BCH codes", IEEE Trans. Inform. Theory, vol. 54, no. 8, pp. 3611-3630, August 2008, which is hereby incorporated by reference in its entirety.

Figure 3:
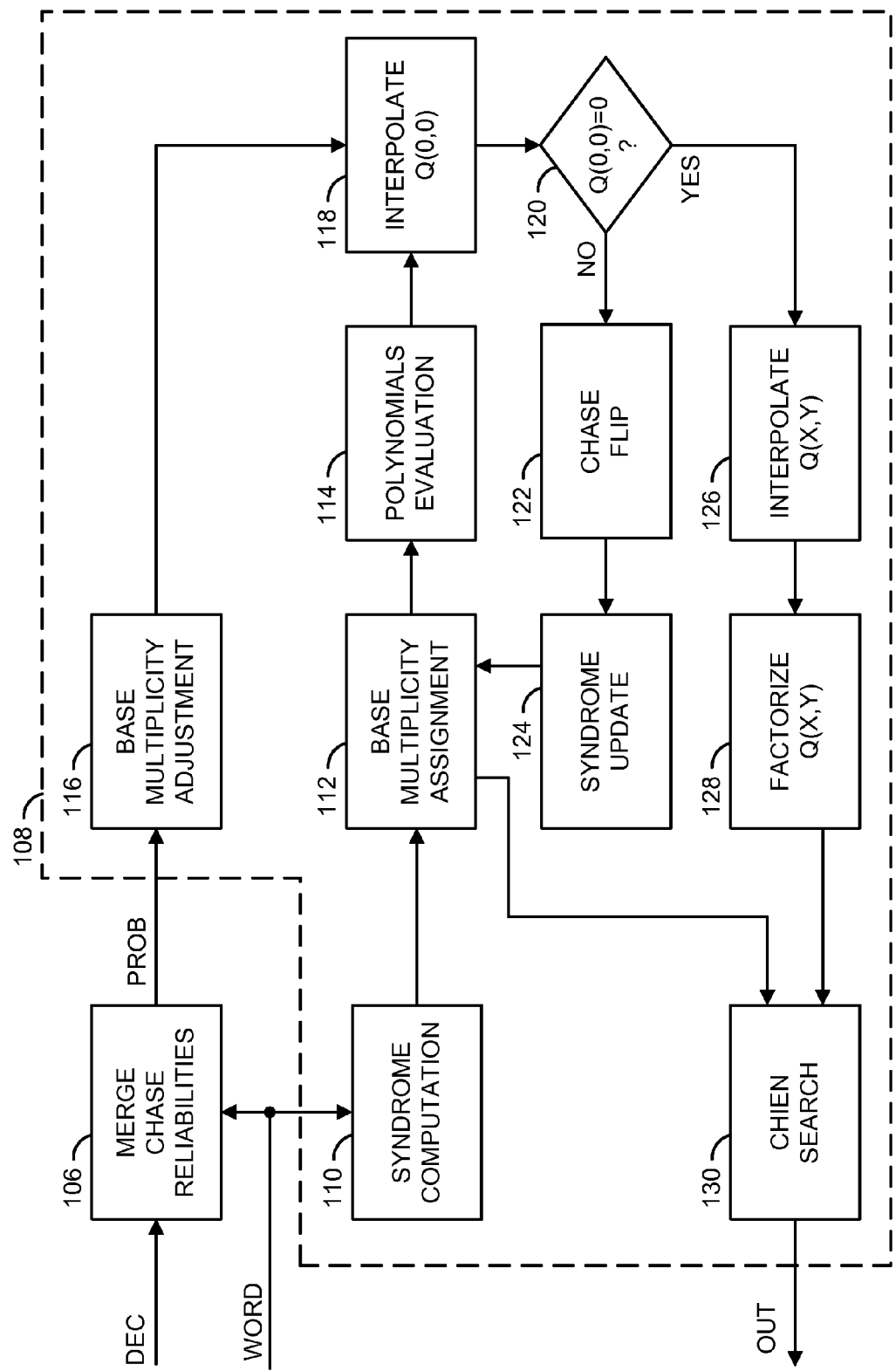
FIG. 3 is a detailed block diagram of an example implementation of a list decoder circuit.

Referring to FIG. 3, a detailed block diagram of an example implementation of the circuit 108 is shown. The circuit 108 generally comprises a block (or circuit) 110, a block (or circuit) 112, a block (or circuit) 114, a block (or circuit) 116, a block (or circuit) 118, a block (or circuit) 120, a block (or circuit) 122, a block (or circuit) 124, a block (or circuit) 126, a block (or circuit) 128 and a block (or circuit) 130. The circuits 110 to 130 may represent modules and/or blocks that may be implemented as hardware, software, a combination of hardware and software, or other implementations.

The signal PROB may be received by the circuit 116. The signal WORD may be received by the circuit 110. The signal OUT may be generated by the circuit 130.

The circuit 110 may implement a syndrome computation circuit. The circuit 110 is generally operational to calculate syndromes for the received codewords in the signal WORD. The syndromes may be presented to the circuit 112.

The circuit 112 may implement a base multiplicity assignment circuit. The circuit 112 may be operational to compute a multiplicity matrix based on the syndromes calculated by the circuit 110. The multiplicity matrix may be presented to the circuit 114.

The circuit 114 may implement a polynomial evaluation circuit. The circuit 114 is generally operational to evaluate a rational polynomial defined as an error locator polynomial divided by a corresponding auxiliary polynomial over the valid error locators. The obtained pairs of error locator and evaluated value may be applied to interpolate a bivariate polynomial Q(x,y). A bivariate polynomial is generally a polynomial with two variables.

The circuit 116 may implement a base multiplicity adjustment circuit. The circuit 116 is generally operational to construct the base multiplicity vector based on the merged Chase reliabilities received in the signal PROB. The multiplicity is generally proportional to the associated symbol error probability. For a symbol involved in Chase flipping, a symbol error probability may be obtained by removing the two most reliable estimations. The base multiplicity vector may be transferred to the circuit 118.

The circuit 118 may implement an interpolation circuit. The circuit 118 may be operational to interpolate the constant term Q(0,0) along the points/pairs computed in the circuit 114, each with the multiplicity computed in the circuit 116. The results of the interpolation may be transferred to the circuit 120.

The circuit 120 may implement a checking circuit. The circuit 120 may be operational to check if a constant term Q(0,0) is zero. If not, the corresponding bivariate polynomial Q(x,y) generally does not yield a valid codeword and thus is invalid. Therefore, Chase flipping may be performed in the circuit 122 in an attempt to correct the errors. If the constant term is zero, the bivariate polynomial Q(x,y) may be calculated in the circuit 126.

The circuit 122 may implement a Chase flipping circuit. The circuit 122 may be operational to flip a symbol based on the provided candidate flipping patterns. After the symbol has been flipped, the syndromes may be updated in the circuit 124.

The circuit 124 may implement a syndrome update circuit. The circuit 124 is generally operational to recalculate the syndromes based on the altered symbols received from the circuit 122. The updated syndromes may be presented back to the circuit 112 where the base multiplicity assignment is performed again.

The circuit 126 may implement an interpolation circuit. The circuit 126 is generally operational to fully compute the bivariate polynomial Q(x,y). The computation may utilize the information that the constant term is zero.

The circuit 128 may implement a factorize circuit. The circuit 128 is generally operational to factorize the polynomial to retrieve the valid codeword in which the n−k least reliable positions are to be determined. The factorized polynomial may be presented to the circuit 130.

The circuit 130 may implement a Chien decoder circuit. The circuit 130 is generally operational to apply the Chien decoding technique to correct any errors that may remain in the n−k positions of the word received from the circuit 128. The corrected word may be presented in the signal OUT.

Figure 4:
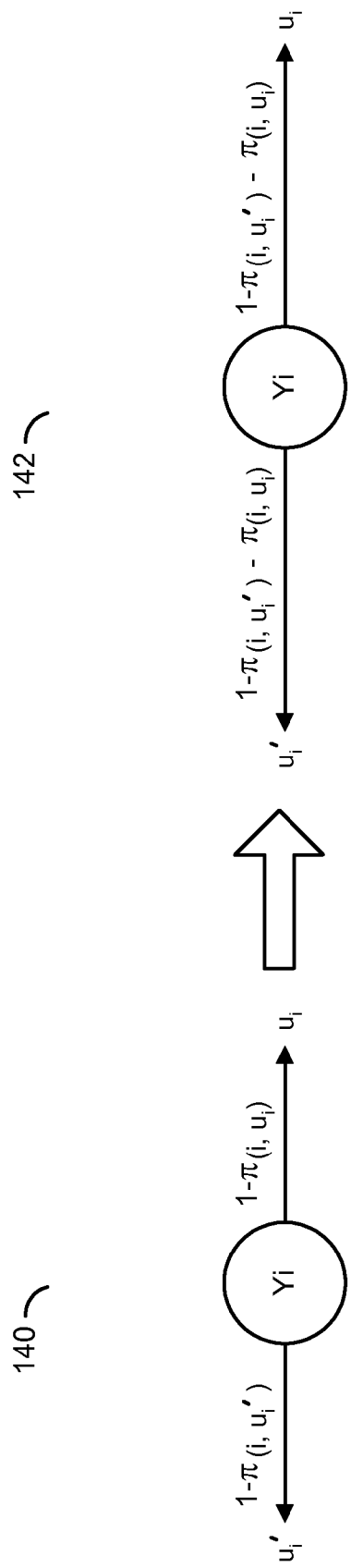
FIG. 4 is a diagram of an example merging of probability values.

Referring to FIG. 4, a diagram of an example merging of probability values is shown. The merging operation may be performed by the circuit 106. Each position (e.g., $y_i$) of the codeword received through the channel may have corresponding hard-decision value (e.g., $u_i$) and a secondary channel decision value (e.g., $u'_i$), see reference arrow 140. The decision values may correspond to an a posteriori probability value (e.g., $\pi_{(i,ui)}$). Each secondary decision value may correspond to an a posteriori probability value (e.g., $\pi_{(i,u'i)}$). The circuit 106 may merge the two probability values for the hard-decision values and the secondary decision values (e.g., $1-\pi_{(i,u'i)}-\pi_{(i,ui)}$) in the unreliable positions, see reference arrow 142. Thus the hard-decision probabilities for position Yi may become a difference between a unity value and a summed probability (e.g., $1-(\pi_{(i,u'i)}+\pi_{(i,ui)})$).

Figure 5:
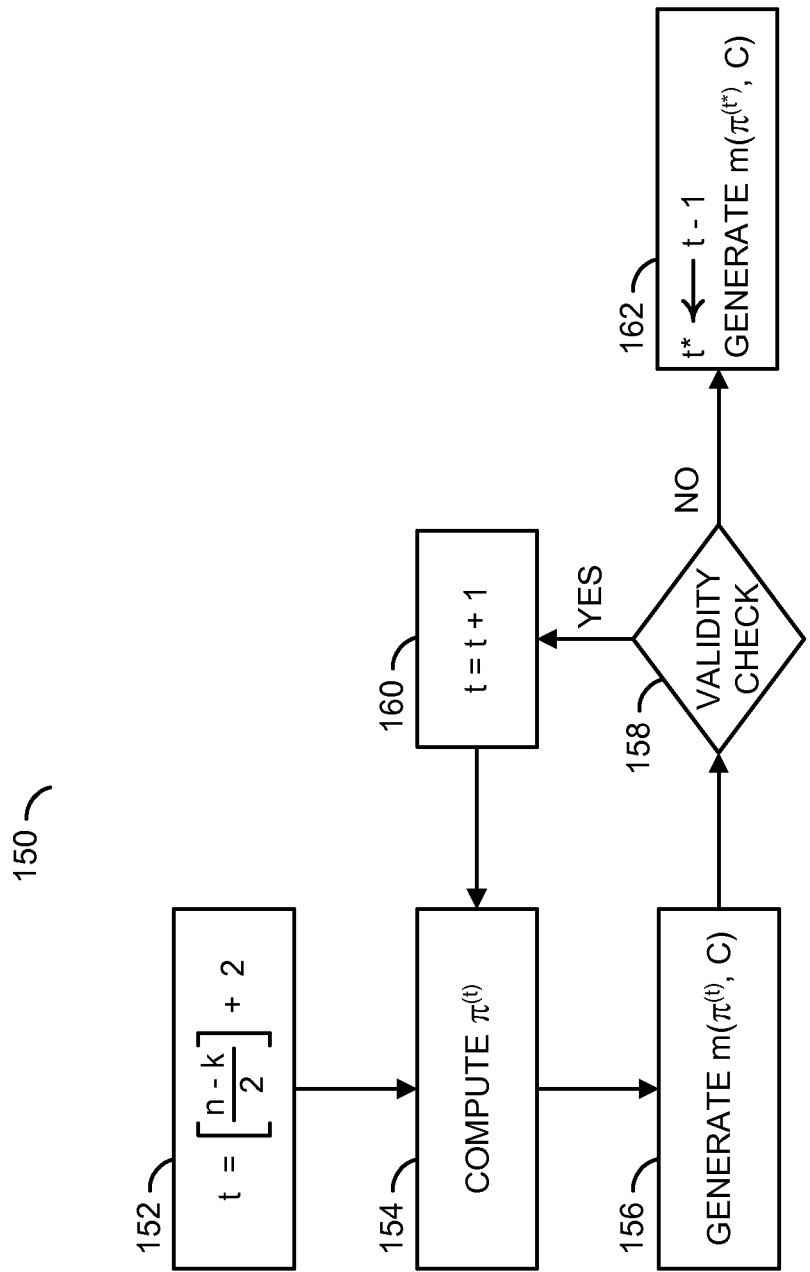
FIG. 5 is a flow diagram of an example method of a base multiplicity adjustment.

Referring to FIG. 5, a flow diagram of an example method 150 of a base multiplicity adjustment is shown. The method (or process) 150 may be implemented in the circuit 116. The method 150 generally comprises a block (or step) 152, a block (or step) 154, a block (or step) 156, a block (or step) 158, a block (or step) 160 and a block (or step) 162. The steps 152-162 may represent modules and/or blocks that may be implemented as hardware, software, a combination of hardware and software, or other implementations.

In the step 152, the circuit 116 may be initialized with a smallest meaningful list error correction capability (e.g., LECC). The variable t may represent a number of errors out of n symbols in a message length of k. Conditional symbol error probabilities may be computed in the step 154 conditioned on the t errors out of the n symbols. In the step 156, an adjusted multiplicity vector may be generated based on the conditional symbol error probability vector generated in the step 154, subject to the overall cost C. A check may be performed in the step 158 to see if the considered number of errors t is correctable in average, based on the multiplicity vector generated in the step 156. If correctable, the number of errors t may be incremented in the step 160. The method 150 may thus return to the steps 154 and 156 to attempt to correct more errors. The cycle around the steps 154, 156, 158 and 160 may continue until the last value of t is the largest correctable value. Thereafter, the multiplicity vector may be generated in the step 162. The resulting multiplicity information may be transferred from the circuit 116 to the circuit 118.

Figure 6:
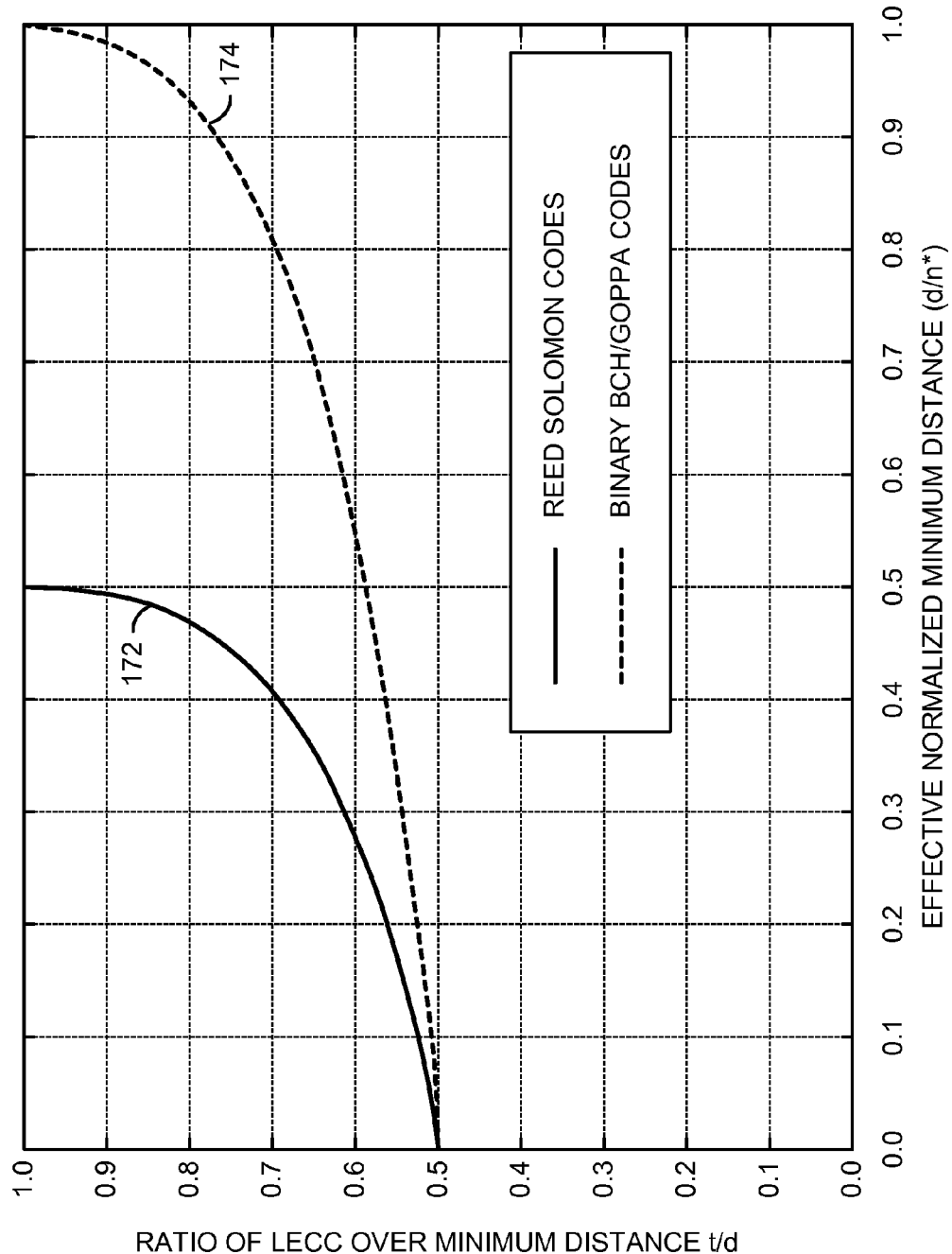
FIG. 6 is a graph of ratios of list decoding capabilities to minimum distances.

Referring to FIG. 6 a graph of ratios of list decoding capabilities to minimum distances as a function of ratio of minimum distances to the effective code length is shown. The Wu list decode technique generally does not take into account the known locations and thus effectively improves the list error correction capability. For a Reed-Solomon code C(n,k,d), the parameter n* may be the effective code length without counting known locations. By interpolating only the remaining uncertain locations in the rational interpolation, the resulting LECC may be improved to $n^*-\sqrt{n^*(n^*-d)}$ as shown by curve 172. The resulting LECC is generally independent of the actual code length n. In particular, when n* reduces toward d, the LECC may approach d−1. For a binary BCH/Goppa code C(n,k,d), the parameter n* may be the effective code length without counting known locations. The resulting LECC may be $$\frac{1}{2}\left(n^* - \sqrt{n^*(n^* - 2d)}\right)$$

and independent of the original code length n, as shown by curve 174. When n* shrinks toward 2d, the LECC generally approaches the limit d−1. In particular, the lists may include all (e.g., up to $2d^2+2$) codewords whose discrepancy bits may be limited to any 2d−1 erasure bits from a received word. The codewords may be generated by applying the list decoding technique twice, an application with the given 2d−1 bits and another application with all flipped 2d−1 bits. In contrast, conventional erasure decoding corrects d−1 errors out of d erasure bits.

Multiple (e.g., two) scenarios generally exist where a received word is partially corrected. A first scenario is an iterative decoding of product codes, where each row (column) component word is partially corrected by the preceding column (row) decoding, herein miscorrection is ignored. Pyndiah demonstrated that the iterative decoding of product codes achieves a near Shannon limit. Several error-correcting codes based on product constructions have been suggested for applications in optical networks at very high data rates. The optical networks (or communication channels) may be asymmetric channels in which errors only change bits from a one value to a zero value occur, since a photon may vanish but may not be created. Furthermore, the errors that may occur in many recently developed semiconductor and optical memory systems are of the asymmetric type. In some other applications, the errors may be of unidirectional type, where all the errors are of the same type, but the type is not known a priori. For a long binary code, each fraction of the 1 bits and the 0 bits may almost be one-half following the law of large numbers. The half fraction generally indicates that the effective code length is reduced almost by half in an asymmetric/unidirectional channel (e.g., circuit 94).

Koetter and Vardy showed a way to translate soft-decision reliability information provided by a channel into a multiplicity matrix that is directly involved in the Guruswami-Sudan method. The resulting method substantially outperforms the Guruswami-Sudan method. However, implementation of the resulting multiplicity transformation technique to the Wu list decode technique may not be handy. An extra parameter, a degree of y in a bivariate polynomial (e.g., Ly) generally has a value dependent on the unknown actual number of errors. A straightforward solution is trial-and-error on the actual number of errors. However, the trial-and-error method is generally not desirable due to many calls, up to $t-t_0$ times the number of calls in the list decoding technique. Therefore, the actual number of errors in the expression of Ly may be replaced by a largest number of errors that may be decoded in a mean sense.

The Chase decoding (which actually refers to Chase-II decoding) may provide suitable algebraic soft-decision decoding methods for high-rate short-to-medium-length codes. A decoding complexity associated with flipping an additional symbol may be O(n), in contrast to O(nd) by directly exploiting hard-decision decoding. Without applying the Chase flipping, secondary channel decisions exhibit small probabilities, thus are generally assigned small multiplicities. Chase exhaustive flipping essentially merges two most reliable channel decisions into a unified estimation with almost twice a higher reliability, thus the multiplicities are literally doubled for the two most reliable channel decisions which involve the Chase flipping.

For a possibly shortened Reed-Solomon C(n,k) code over a finite field Fq, a codeword polynomial C(x) generally satisfies formula 1 as follows:

$$C(\alpha^i)=0, \text{for } i=m_0, m_0+1, \ldots, m_0+n-k-1 \qquad (1)$$

where α denotes a primitive element of Fq and $m_0$ may be an arbitrary integer. A minimum Hamming distance of the code is d=n−k+1, an attribute generally known as maximally-distance-separable attribute.

Let C(x) denote the transmitted codeword polynomial and R(x) the received word polynomial. A Berlekamp-Massey technique generally provides a foundation for the list decoding technique. The Berlekamp-Massey technique may compute syndrome values (e.g., $S_i$) per formula 2 as follows:

$$S_i = R(\alpha^{i+m_0}), \text{for } i=0,1,2,\ldots,n-k-1 \qquad (2)$$

If all n−k syndrome values are zero, R(x) may be a codeword polynomial and thus is presumed that C(x)=R(x) (e.g., no errors have occurred). Otherwise, let e denote the unknown number of errors, $$X_i \in \{\alpha^j\}_{j=0}^{n-1} \text{ for } i=1, 2, \ldots, e,$$

denote the error locations, and $Y_i \in F_q \setminus \{0\}$ for i=1, 2, . . . , e, denote the corresponding error magnitudes.

A syndrome polynomial may be defined by formula 3 as follows:

$$S(x)=S_0+S_1x+S_2x^2+\ldots+S_{n-k-1}x^{n-k-1} \qquad (3)$$

An error locator polynomial may be defined by formula 4 as follows:

$$\Lambda(x) = \prod_{i=1}^{e}(1-X_ix) = 1+\Lambda_1x+\Lambda_2x^2+\ldots+\Lambda_ex^e \qquad (4)$$

An error evaluator polynomial is generally defined by formula 5 as follows:

$$\Omega(x) = \sum_{i=1}^{e} Y_i X_i^{m_0} \prod_{j=1, j \neq i}^{e}(1-X_jx) \qquad (5)$$
$$= \Omega_0 + \Omega_1 x + \Omega_2 x^2 + \ldots + \Omega_{e-1}x^{e-1}$$

The three polynomials generally satisfy a key equation 6 as follows:

$$\Omega(x)=\Lambda(x)S(x)x^{n-k} (\text{mod } x^{n-k}) \qquad (6)$$

The Berlekamp-Massey technique may be used to solve the above key equation, given that the number of errors e does not exceed the error-correction capability $\lfloor(n-k)/2\rfloor$. The Berlekamp-Massey technique may be re-formulated as follows:

Input: $S=[S_0, S_1, S_2, \ldots, S_{n-k-1}]$
Initialization: $\Lambda^{(0)}(x)=1$, $B^{(0)}(x)=1$ and $L_\Lambda^{(0)}=0$, $L_B^{(0)}=0$
For r=0, 1, 2, . . . , n−k−1, do:
  Compute $$\Delta^{(r+1)} = \sum_{i=0}^{L_\Lambda^{(r)}} \Lambda_i^{(r)} \cdot S_{r-i}$$

Compute $\Lambda^{(r+1)}(x)=\Lambda^{(r)}(x)-\Delta^{(r+1)} \cdot xB^{(r)}(x)$
  If $\Delta^{(r+1)} \neq 0$ and $2L_\Lambda^{(r)} \leq r$, then
    Set $B^{(r+1)}(x) \leftarrow (\Delta^{(r+1)})^{-1} \cdot \Lambda^{(r)}(x)$
    Set $L_\Lambda^{(r+1)} \leftarrow L_B^{(r)}+1$, $L_B^{(r+1)} \leftarrow L_\Lambda^{(r)}$
  Else
    Set $B^{(r+1)}(x) \leftarrow xB^{(r)}(x)$
    Set $L_B^{(r+1)} \leftarrow L_B^{(r)}+1$, $L_\Lambda^{(r+1)} \leftarrow L_\Lambda^{(r)}$
Output: $\Lambda(x)$, $B(x)$, $L_\Lambda$ and $L_B$.

Let $\Lambda^*(x)$ be a true error locator polynomial as defined in formula 4. Let $\Lambda(x)$ and $B(x)$ be the error locator and correction polynomials, respectively, obtained from the Berlekamp-Massey technique. Hence, $\Lambda^*(x)$ generally exhibits the form shown in formula 7 as follows:

$$\Lambda^*(x)=\Lambda(x) \cdot \lambda^*(x)+xB(x) \cdot b^*(x) \qquad (7)$$

where the polynomials $\lambda^*(x)$ and $b^*(x)$ may exhibit the following properties:

(i). $\lambda_0^* = 1$;

(ii). If $b^*(x) = 0$, then $\lambda^*(x) = 1$;

(iii). $\lambda^*(x)$ and $b^*(x)$ are coprime;

(iv). $\deg(\lambda^*(x)) = \deg(\Lambda^*(x)) - L_\Lambda$ & $\deg(b^*(x)) \leq \deg(\Lambda^*(x)) - L_{xB}$, or $\deg(\lambda^*(x)) \leq \deg(\Lambda^*(x)) - L_\Lambda$ & $\deg(b^*(x)) = \deg(\Lambda^*(x)) - L_{xB}$;

(v). If $\deg(\Lambda^*(x)) < n - k$, then $\lambda^*(x)$ and $b^*(x)$ are unique.

Dividing both sides of formula 7 by $xB(x)$ generally results in formula 8 as follows:

$$\frac{\Lambda^*(x)}{xB(x)} = \frac{\Lambda(x)}{xB(x)} \bullet \lambda^*(x) + b^*(x). \tag{8}$$

Define $y_i$ per formula 9 as follows:

$$y_i = -\frac{\Lambda(\alpha^{-i})}{\alpha^{-i} B(\alpha^{-i})}, \text{ for } i = 0, 1, 2, \ldots, n-1 \tag{9}$$

where $y_i$ may be set to infinity when $B(\alpha^{-i}) = 0$. Let $\alpha^{-i_1}, \alpha^{-i_2}, \ldots, \alpha^{-i_e}$, be all the valid roots of the true error locator polynomial $\Lambda^*(x)$. Therefore, $y \cdot \lambda^*(x) - b^*(x)$ generally passes precisely through e points, $(\alpha^{-i_1}, y_{i_1}), (\alpha^{-i_2}, y_{i_2}), \ldots, (\alpha^{-i_e}, y_{i_e})$.

Given a set of n distinct points $$\{(\alpha^{-i}, y_i)\}_{i=0}^{n-1},$$

a rational functions $y(x)$ that passes through t points (where $t \geq t_0 = d/2$) may be found, in the sense that $y(\alpha^{-i}) = y_i$. If $y_i = \infty$, $y(x)$ may contain a pole $\alpha^{-i}$. The pole may exist because when $B(\alpha^{-i}) = 0$, $\lambda(\alpha^{-i})$ may be zero because $B(x)$ and $\Lambda(x)$ are coprime and thus may not share the root. Hence, a rational curve-fitting problem may be used for the form of $y \cdot \lambda(x) - b(x)$. The weight (e.g., w) of y may be assigned per formula 10 as follows:

$$w = L_\Lambda - L_{xB} \tag{10}$$

Let $Q(x,y)$ be a bivariate polynomial passing through all n points $\{(1, y_0), (\alpha^{-1}, y_1), (\alpha^{-2}, y_2), \ldots, (\alpha^{-(n-1)}, y_{n-1})\}$, where $y_i$ is generally defined in formula 9, each with multiplicity m. If formula 11 is satisfied as follows:

$$(t - L_\Lambda) L_y + \deg_{1,w}(Q(x,y)) < tm \tag{11}$$

where $L_y$ may denote the degree of y in $Q(x,y)$ and $\deg_{1,w}(Q(x,y))$ (where w is defined in formula 10) may denote the $(1,w)$-weighted degree of $Q(x,y)$, thus $Q(x,y)$ generally contains all factors of the form $y\lambda(x) - b(x)$ which pass through t points (where $t \geq L_\Lambda$).

A sufficient condition for $Q(x,y)$ to pass through all n points $\{(1, y_0), (\alpha^{-1}, y_1), (\alpha^{-2}, y_2), \ldots, (\alpha^{-(n-1)}, y_{n-1})\}$, each with multiplicity m, may be that the number of coefficients (e.g., number of degrees of freedom) of $Q(x,y)$ is greater than the number of linear constraints. The number of degrees of freedom, denoted by $N_{free}$, is generally defined by formula 12 as follows:

$$N_{free} = \sum_{i=0}^{L_y} (\deg_{1,w}(Q(x,y)) + 1 - iw) \tag{12}$$

$$= \frac{(2\deg_{1,w}(Q(x,y)) + 2 - wL_y)(L_y + 1)}{2}$$

Passing through a point with multiplicity m may result in $m(m+1)/2$ linearly independent constraints. Thus, an overall number of linear constraints, denoted by $N_{cstr}$, is generally given by formula 13 as follows:

$$N_{cstr} = \frac{nm(m+1)}{2}. \tag{13}$$

The number of degrees of freedom may be maximized subject to fixed number of errors $e = t$ and the fixed multiplicity m and the constraint of formula 11, per formula 14 as follows $$N_{free} = \frac{(2\deg_{1,w}(Q(x,y)) + 2 - wL_y)(L_y + 1)}{2} \tag{14}$$

$$= \leq \frac{(2(tm - 1 - (t - L_\Lambda)L_y) + 2 - wL_y)(L_y + 1)}{2}$$

$$= (tm - L_y(t - t0))(L_y + 1)$$

$$= -(t - t0)L_2 y + L_y(tm - t + t0) + tm$$

$$= -(t - t_0)\left(L_y - \frac{tm - t + t_0}{2t - 2t_0}\right)^2 + \frac{(tm + t - t_0)^2}{4(t - t_0)}$$

where $t_0 = d/2$, "=" may be achieved in "≤" if and only if formula 15 is satisfied as follows:

$$\deg_{1,w}(Q^*(x,y)) = tm - 1 - (t - L_\Lambda)L_y \tag{15}$$

which may accommodate the zero constraint in formula 11. The first equality in formula 14 may be due to formula 16 as follows:

$$L_\Lambda - \frac{w}{2} = \frac{L_\Lambda + L_{xB}}{2} = \frac{n - k + 1}{2} = t_0 \tag{16}$$

The maximum number of degrees of freedom may be achieved by choosing $L^*y$ to be the closest integer to $$\frac{tm - t + t_0}{2t - 2t_0}$$

per formula 17 as follows:

$$L_y^* = \left\lfloor \frac{tm - t + t_0}{2t - 2t_0} + 0.5 \right\rfloor = \left\lfloor \frac{tm}{2t - 2t_0} \right\rfloor. \tag{17}$$

Therefore, a good choice of m may be a minimum integer that enforces $N_{free} > N_{cstr}$, per formula 18 as follows:

$$-(t - t_0)\left(\left\lfloor \frac{tm}{2t - 2t_0} \right\rfloor - \frac{tm - t + t_0}{2t - 2t_0}\right)^2 + \frac{(tm + t - t_0)^2}{4(t - t_0)} > \frac{nm(m+1)}{2} \tag{18}$$

The maximum number of degrees of freedom is bounded by formula 19 as follows:

$$\max\{N_{free}\} = -(t-t_0)\left(\left\lfloor\frac{tm}{2t-2t_0}\right\rfloor - \frac{tm-t+t_0}{2t-2t_0}\right)^2 + \frac{(tm+t-t_0)^2}{4(t-t_0)} \geq \qquad (19)$$
$$-\frac{t-t_0}{4} + \frac{(tm+t-t_0)^2}{4(t-t_0)}.$$

Hence, to solve for the linear equation system, formula 20 may be enforced as follows:

$$\frac{(tm+t-t_0)^2}{4(t-t_0)} - \frac{t-t_0}{4} > \frac{nm(m+1)}{2}, \qquad (20)$$

Formula 20 may be reduced to formula 21 as follows:

$$m^2(t^2-2n(t-t_0)) - 2m(t-t_0)(n-t) > 0 \qquad (21)$$

The above inequality generally holds true for sufficiently large m if and only if formula 22 is satisfied as follows:

$$t^2 - 2n(t-t_0) > 0 \qquad (22)$$

which may yield the general Johnson bound per formula 23 as follows:

$$t < n - \sqrt{n(n-d)} \qquad (23)$$

The lower bound given by formula 19 may be tight in terms of the LECC t, while affecting the value of multiplicity m to achieve a particular LECC t. For any t satisfying formula 19, the multiplicity m* may be chose per formula 24 as follows:

$$m^* = \left\lfloor\frac{2(t-t_0)(n-t)}{t^2 - 2n(t-t_0)} + 1\right\rfloor = \left\lfloor\frac{t(2t_0 - t)}{t^2 - 2n(t-t_0)}\right\rfloor \qquad (24)$$

Figure 7:
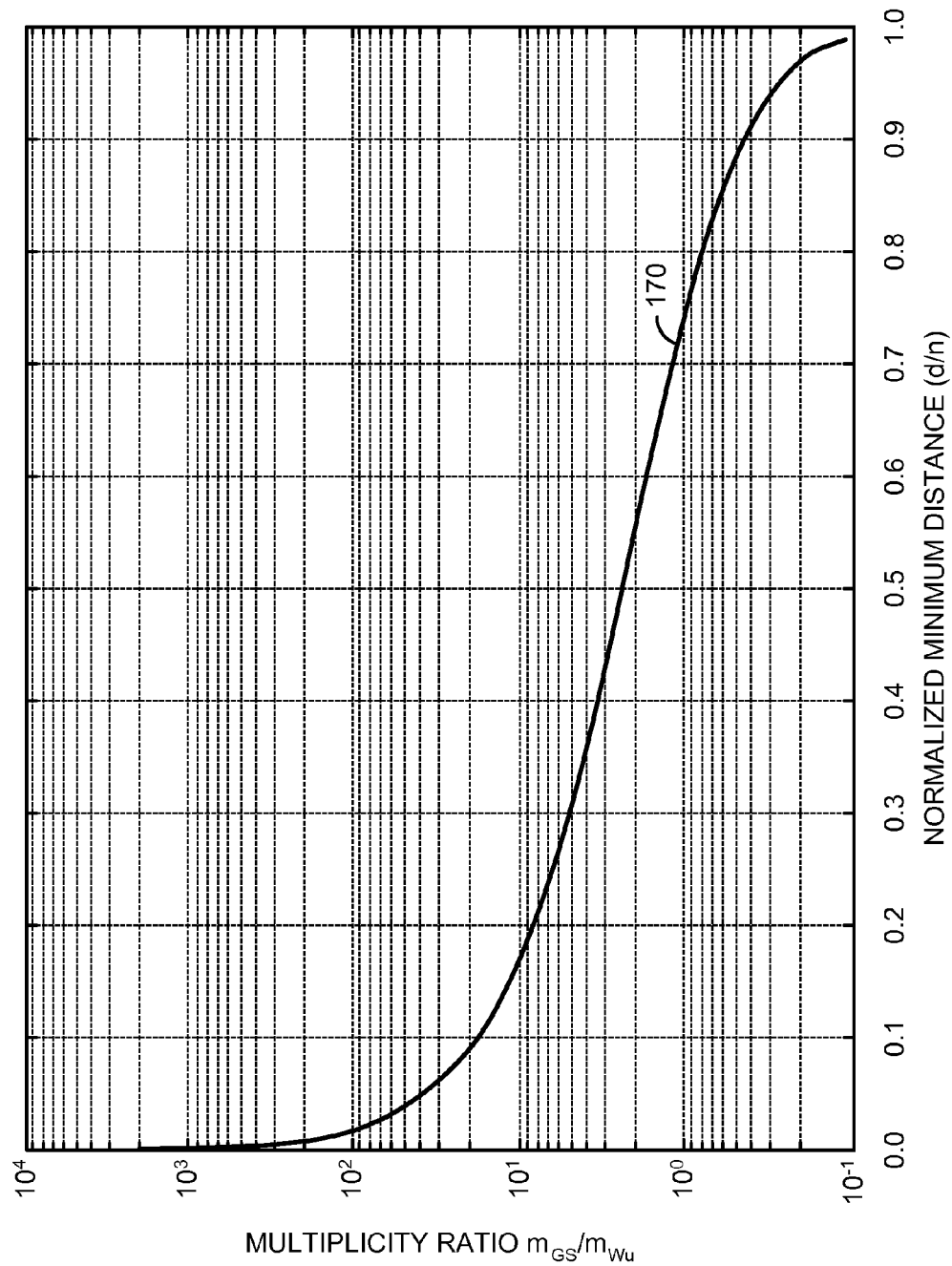
FIG. 7 is a graph of a multiplicity ratio of a Guruswami-Sudan technique over a Wu list decode technique.

Referring to FIG. 7, a graph of a multiplicity ratio 170 of the Guruswami-Sudan technique over the Wu list decode technique is shown. The graph generally indicates that the Wu list decode technique may be more efficient when a code rate is above roughly 0.25. The multiplicity ratio of the Guruswami-Sudan technique over the Wu list decode technique for decoding Reed-Solomon may code up to the Johnson bound.

An underlying generator polynomial of a BCH code generally contains consecutive roots $\alpha, \alpha^2, \ldots, \alpha^{2t}$. For an underlying binary BCH code, the designed minimum distance d may always be odd, which is actually a typically tight lower bound of the true minimum distance.

The Berlekamp technique may be a simplified version of the Berlekamp-Massey technique for decoding binary BCH codes by incorporating a special syndrome property per formula 25 as follows:

$$S_{2i+1} = S_i^2, \text{ for } i=0,1,2, \qquad (25)$$

which generally yields zero discrepancies at even iterations of the Berlekamp-Massey technique. The Berlekamp technique may be reformulated as follows:

Input: $S = [S_0, S_1, S_2, \ldots, S_{d-2}]$
Initialization: $\Lambda^{(0)}(x) = 1$, $B^{(-1)}(x) = x^{-1}$, $L_\Lambda = 0$, $L_B^{(-1)} = -1$
For $r = 0, \ldots, d-3$, do:
  Compute $$\Delta^{(r+2)} = \sum_{i=0}^{L_\Lambda^{(r)}} \Lambda_i^{(r)} \cdot S_{r-i}$$

Compute $\Lambda^{(r+2)}(x) = \Lambda^{(r)}(x) - \Delta^{(r+2)} \cdot x^2 B^{(r-1)}(x)$
  If $\Delta^{(r+2)} \neq 0$ and $2L_\Lambda^{(r)} = r$, then
    Set $B^{(r+1)}(X) \leftarrow (\Delta^{(r+2)})^{-1} \cdot \Lambda^{(r)}(X)$
    Set $L_\Lambda^{(r+2)} \leftarrow L_B^{(r-1)} + 2$, $L_B^{(r+1)} \leftarrow L_\Lambda^{(r)}$ Else
    Set $B^{(r+1)}(x) \leftarrow x^2 B^{(r-1)}(x)$
    Set $L_B^{(r+1)} \leftarrow L_B^{(r-1)} + 2$, $L_\Lambda^{(r+2)} \leftarrow L_\Lambda^{(r)}$
Output: $\Lambda(x)$, $B(x)$, $L_\Lambda$, $L_B$.

Let $\Lambda^*(x)$ be the true error locator polynomial as defined in formula 4. Let $\Lambda(x)$ and $B(x)$ be the error locator and correction polynomials, respectively, obtained from the re-formulated Berlekamp technique. Therefore, $\Lambda^*(x)$ may exhibit the form per equation 26 as follows:

$$\Lambda^*(x) = \Lambda(x) \cdot \lambda^*(x^2) + x^2 B(x) \cdot b^*(x^2) \qquad (26)$$

where the polynomials $\lambda^*(x)$ and $b^*(x)$ may exhibit the following properties:
(i). $\lambda_0^* = 1$;
(ii). If $b^*(x) = 0$, then $\lambda^*(x) = 1$;
(iii). $\lambda^*(x)$ and $b^*(x)$ are coprime;
(iv). $2\deg(\lambda^*(x)) = \deg(\Lambda^*(x)) - L_\Lambda$ and $2\deg(b^*(x)) \leq \deg(\Lambda^*(x)) - L_{x^2B}$, or $2\deg(\lambda^*(x)) < \deg(\Lambda^*(x)) - L_\Lambda$ and $2\deg(b^*(x)) = \deg(\Lambda^*(x)) - L_{x^2B}$;
(v). If $\deg(\Lambda^*(x)) \leq d-1$, then $\lambda^*(x)$ and $b^*(x)$ may be unique.
The form of formula 26 may be incorporated into the rational interpolation process to optimize the LECC. Define $y_i$ per formula 27 as follows:

$$y_i = -\frac{\Lambda(\alpha^{-i})}{\alpha^{-2i} B(\alpha^{-i})}, \text{ for } i=0,1,2,\ldots,n-1 \qquad (27)$$

To determine the form of $y\lambda(x^2) - b(x^2)$, the weight (e.g., w) of y may be assigned per formula 28 as follows:

$$w = L_\Lambda - L_{x^2B} \qquad (28)$$

which may always be odd since $L_\Lambda + L_{x^2B} = d$ is odd.

Let $\Lambda(x)$ and $B(x)$ be the error locator and correction polynomials, respectively, obtained from the re-formulated Berlekamp technique. Let $Q(x,y)$ be a bivariate polynomial passing through all n points $\{(1,y_0), (\alpha^{-2},y_1), (\alpha^{-4},y_2), \ldots, (\alpha^{-2(n-1)},y_{n-1})\}$ where $y_i$ may be defined in formula 27, each with multiplicity m. If formula 29 is satisfied as follows:

$$(t-L_\Lambda)L_y + \deg_{2,w}(Q(x,y)) < 2tm \qquad (29)$$

where $L_y$ denotes the power of y in $Q(x,y)$ and $\deg_{2,w}(Q(x,y))$ denotes the (2,w)-weighted degree of $Q(x,y)$ and w is defined in formula 28), then $Q(x^2,y)$ may contain all factors of the form $y\lambda(x^2) - b(x^2)$ which pass through t points (where $t \geq L_\Lambda$).

The number of degrees of freedom is generally given by formula 30 as follows:

$$N_{free} = \sum_{i=0}^{L_y}\left(1 + \left\lfloor\frac{\deg_{2,w}(Q(x,y)) - iw}{2}\right\rfloor\right) \geq \qquad (30)$$

$$\sum_{i=0}^{L_y}\left(1 + \frac{\deg_{2,w}(Q(x,y)) - iw - 1}{2}\right)$$

$$= \frac{(\deg_{2,w}(Q(x,y)) + 1 - L_y w/2)(L_y + 1)}{2}.$$

Define $t_0$ per formula 31 as follows:

$$t_0 = L_\Lambda - w/2 = \frac{L_\Lambda + L_{x^2B}}{2} = \frac{d}{2}. \qquad (31)$$

The above definition is generally consistent with the case of Reed-Solomon codes.

The lower bound of $N_{free}$, $$\frac{(\deg_{2,w}(Q(x,y))+1-L_yw/2)(L_y+1)}{2},$$

may be maximized subject to the fixed number of errors t, fixed multiplicity m and the zero constraint of formula 29. Thus, $N_{free}$ free may be defined by formula 32 as follows:

$$N_{free} = \frac{(\deg_{2,w}(Q(x,y))+1-L_yw/2)(L_y+1)}{2} \leq \qquad (32)$$

$$\frac{1}{2}(2tm-L_y(t-t_0))(L_y+1)$$

$$= -\frac{t-t_0}{2}L_y^2 + \frac{2tm-t+t_0}{2}L_y + tm$$

$$= -\frac{t-t_0}{2}\left(L_y - \frac{2tm-t+t_0}{2(t-t_0)}\right)^2 + \frac{(2tm+t-t_0)^2}{8(t-t_0)},$$

where "=" in the "≤" may be achieved if and only if formula 33 is satisfied as follows:

$$\deg_{2,w}(Q^*(x,y))=2tm-1-L_y(t-L_\Lambda) \qquad (33)$$

The maximum number of degrees of freedom may be achieved by choosing $L^*_y$ to be the closest integer to $$\frac{2tm-t+t_0}{2t-2t_0},$$

leading to formula 33 as follows:

$$L^*_y = \left\lfloor \frac{2tm-t+t_0}{2t-2t_0} + 0.5 \right\rfloor = \left\lfloor \frac{tm}{t-t_0} \right\rfloor. \qquad (34)$$

Therefore, the maximum number of degrees of freedom may have the a lower bound per formula 35 as follows:

$$\frac{t-t_0}{8} + \frac{(2tm+t-t_0)^2}{8(t-t_0)} = \frac{t^2m^2+tm(t-t_0)}{2(t-t_0)} \qquad (35)$$

Hence, to solve for the linear equation system, enforcing formula 36 may be sufficient as follows:

$$\frac{t^2m^2+tm(t-t_0)}{2(t-t_0)} > \frac{nm(m+1)}{2} \qquad (36)$$

which may be similar to formula 37 as follows:

$$m^2(t^2-n(t-t_0))-m(t-t_0)(n-t)>0 \qquad (37)$$

The above condition generally holds true for sufficiently large m if and only if formula 38 is satisfied as follows:

$$t^2-n(t-t_0)>0 \qquad (38)$$

which approaches the binary Johnson bound given in formula 39 as follows:

$$t < \frac{n-\sqrt{n(n-4t_0)}}{2} = \frac{n-\sqrt{n(n-2d)}}{2} \qquad (39)$$

When formula 29 is satisfied, the multiplicity m may be chosen per formula 40 as follows:

$$m^* = \left\lfloor \frac{(t-t_0)(n-t)}{t^2-n(t-t_0)} + 1 \right\rfloor = \left\lfloor \frac{tt_0}{t^2-n(t-t_0)} \right\rfloor \qquad (40)$$

The above results may also apply to binary Goppa codes. Therefore, binary BCH codes may not be differentiated from Goppa codes hereafter.

In many applications, correction of a fraction of the received word may be achieved through other means. For example, partial correction may be accomplished by product Reed-Solomon codes, wherein some symbols of a column (row) Reed-Solomon code may already be corrected during the preceding decoding of row (column) Reed-Solomon codes.

Let the transmitted codewords be defined by a (n,k,d) Reed-Solomon code. Let errors be limited to a subset I∈{0, 1, 2, ..., n−1}, and n*=|I|. By passing through n* points $\{(\alpha^i,y_i)\}_{i \in I}$, each with multiplicity $$m = \left\lfloor \frac{t(d-t)}{t^2-2n^*t-n^*d} \right\rfloor,$$

the rational curve fitting technique generally lists all candidate Reed-Solomon codewords with up to $t<n^*-\sqrt{n^*(n^*-d)}$ errors.

The closer the effective code length n* is to d, the closer the list decoding capability t is to d, as shown by curve 172 in FIG. 6. In the case n*=n−k+1=d, the erasure-only list decoding may degenerate to the conventional erasure-only decoding which corrects up to d−1 errors. For binary BCH/Goppa codes, when a fraction of the bits are pre-corrected, an improved list decoding capability may result, as shown by curve 174 in FIG. 6.

Let transmitted codewords be defined by a (n,k,d) binary BCH/Goppa code. Let errors be limited to a subset I∈{0, 1, 2, ..., n−1}, and n*=|I|. By passing through n* points $\{(\alpha^i,y_i)\}_{i \in I}$, each with multiplicity $$m = \left\lfloor \frac{td/2}{t^2-n^*(t-d/2)} \right\rfloor,$$

the rational curve fitting technique generally lists all candidate codewords with up to $$t < \frac{1}{2}\left(n^* - \sqrt{n^*(n^*-2d)}\right)$$

errors. In the case n*=2d, the erasure-only list decoding may correct up to d−1 errors out of 2d erasure locations.

Let a transmitted codeword be defined by a (n,k,d) binary BCH/Goppa code. Let errors be limited to a subset I∈{0, 1, 2, ..., n−1}, and |I|=2d−1. Thus, any errors among 2d−1 erasure locations may be list corrected by (i) applying the rational curve fitting technique to pass through 2d points $\{(\alpha^i, y_i)\}_{i \in I}$, each with multiplicity m=d(d−1)2, and (ii) flipping all 2d−1 erasure locations and applying the rational curve fitting technique to pass through 2d−1 points $\{(\alpha^i, y_i)\}_{i \in I}$, each with multiplicity m=(d(d−1))/2.

The list size of erasing 2d−1 bits may be upper bounded by twice (due to applying twice the rational curve fitting technique) the degree of y in the bi-variate polynomial Q(x,y), which is computed in the rational interpolation per formula 41 as follows:

$$L = 2\left(\frac{tm + 0.25}{t - d/2}\right) = 2\left(\frac{(d-1)\frac{d(d-1)}{2} + 0.25}{d - 1 - d/2}\right) \quad (41)$$

$$= 2d^2 + 2 + 2\left\lfloor \frac{5}{2d - 4} \right\rfloor$$

$$= \begin{cases} 2d^2 + 2; & \text{if } d > 3 \\ 24; & \text{if } d = 3 \end{cases}$$

Koetter and Vardy proposed a near-optimal procedure to transform the probabilistic reliability information into a set of interpolation multiplicities for the Guruswami-Sudan technique. Some embodiments of the present invention may convert the symbol error probabilities into the corresponding multiplicities for the proposed list decoding technique. However, implementing the Koetter-Vardy conversion strategy may not be handy because of an extra parameter, $L_y$, whose value may be dependent on the unknown actual number of errors. A straightforward solution may be trial-and-error on the actual number of errors (e.g., e). The trial-and-error method is generally not desirable due to calls of up to $\lfloor e - t_0 \rfloor$ times the number of calls in the list decoding technique. To effectively circumvent the obstacle, the actual number of errors in the expression $L_y$ may be replaced by the largest number of errors that may be decoded in the mean sense.

A memoryless channel may be defined as a collection of a finite field alphabet Fq, an output alphabet Y, and q functions per formula 42 as follows:

$$f(y|x):D \text{ maps to } R, \text{for all } x \in Fq \quad (42)$$

Upon receiving a channel word y=[$y_1, y_2, \ldots, y_n$], a hard-decision vector u=[$u_1, u_2, \ldots, u_n$] may be determined per formula 43 as follows:

$$u_i = \underset{\gamma \in Fq}{\operatorname{argmax}} Pr(X = \gamma | Y = y_i) = \underset{\gamma \in Fq}{\operatorname{argmax}} \frac{f(y_i|\gamma)}{\sum_{x \in Fq} f(y_i|x)} \quad (43)$$

where the second equality generally follows from an assumption that X is uniform. An error probability of a symbol may be determined by formula 44 as follows:

$$\pi_i = Pr(x \neq u_i | Y = y_i) = \frac{\sum_{x \neq u_i} f(y_i|x)}{\sum_{x \in Fq} f(y_i|x)} \quad (44)$$

Consider a conditional distribution generally having t errors out of n symbols, which is generally denoted by E=t/n. For notation conciseness, $u_y$ may denote the hard-decision symbol of received channel output y. Therefore, the memoryless channel may be defined per formula 45 as follows:

$$f(y|x, E = t/n) = f(y|x, u_y = x, E = t/n) Pr(x = u_y | x, E = t/n) + \quad (45)$$
$$f(y|x, u_y \neq x, E = t/n) Pr(x \neq u_y | x, E = t/n) =$$
$$((n-t)/n) f(y|x, u_y = x) U(u_y = x|x) +$$
$$(t/n) f(y|x, u_y \neq x) U(u_y \neq x|x) =$$
$$\frac{n-t}{n} \frac{f(y|x)}{Pr(x = u_y|x)} U(u_y = x|x) + \frac{t}{n} \frac{f(y|x)}{Pr(x \neq u_y|x)} U(u_y \neq x|x)$$

where U(·) may be a step function. Following formulae 44 and 45, a symbol error probability, given t errors out of n symbols, is generally determined by formula 46 as follows:

$$\pi^{(t)} = Pr(x \neq u_y | Y = y, E = t/n) \quad (46)$$

$$= \frac{\sum_{x \neq u_y} f\left(y|x, E = \frac{t}{n}\right)}{\sum_{x \in Fq} f\left(y|x, E = \frac{t}{n}\right)}$$

$$= \frac{\sum_{x \neq u_y} f\left(y|x, x \neq u_y, E = \frac{t}{n}\right)}{\sum_{x \neq u_y} f\left(y|x, x \neq u_y, E + \frac{t}{n}\right) + f\left(y|x, u_y = x, E = \frac{t}{n}\right)}$$

$$= \frac{\frac{t/n}{Pr(x \neq u_y|x)} \sum_{x \neq u_y} f(y|x)}{\frac{t/n}{Pr(x \neq u_y|x)} \sum_{x \neq u_y} f(y|x) + \frac{(n-t)/n}{Pr(x = u_y|x)} f(y|x = u_y)}$$

Given a multiplicity vector m=[$m_1, m_2, \ldots, m_n$], a cost function (e.g., (C(m)) may be defined by formula 47 as follows:

$$C(m) = \frac{1}{2} \sum_{i=1}^{n} m_i(m_i + 1). \quad (47)$$

Given t errors out of n symbols, a binomial distribution of each multiplicity $m_i$ may be defined by formula 48 as follows:

$$\begin{cases} P(M_i = m_i) = \pi_i^{(t)} \\ P(M_i = 0) = 1 - \pi_i^{(t)} \end{cases} \text{ for } i = 1, 2, 3, \ldots, n \quad (48)$$

An expected score with respect to the random vector $M_m = [M_1, M_2, \ldots, M_n]$ may be defined per formula 49 as follows:

$$E\{M_m\} = E \sum_{i=1}^{n} M_i = \sum_{i=1}^{n} m_i \pi_i^{(t)} = \langle m, \pi^{(t)} \rangle \quad (49)$$

where <·,·> generally denotes an inner product. The variance of the score may be given by formula 50 as follows:

$$\delta^2\{M_m\} = \sum_{i=1}^{n} \delta^2\{M_i\} = \sum_{i=1}^{n} m_i^2 \left(\pi_i^{(t)} - (\pi_i^{(t)})^2\right) \quad (50)$$

When $\pi^{(t)}_i$, for i=1, 2, ..., n, may be identical (e.g., $\pi^{(t)}_i$=t/n), the multiplicities $m_i$, for i=1, 2, ..., n, may also be identical. Therefore, formula 51 may be satisfied as follows:

$$\frac{\{M\}}{\delta\{M_m\}} = \sqrt{\frac{n\pi_i^{(t)}}{1-\pi_i^{(t)}}} = \sqrt{\frac{nt}{n-t}} \gg 1. \tag{51}$$

Therefore, the inequality of formula 52 generally holds as follows:

$$E\{M_m\} \gg \delta\{M_m\} \tag{52}$$

Maximizing the expected score may produce formula 53 as follows:

$$m(\pi^{(t)}, C) = \arg\max E\{M_m\}$$

$$m \in M(C) \tag{53}$$

where $$M(C) = \left\{ m \in \mathbb{Z}^n : \frac{1}{2}\sum_{i=1}^{n} m_i(m_i + 1) \leq C \right\} \tag{54}$$

A multiplicity vector M(C) may be interatively constructed as follows:
  Inputs: π, C
  Initialization: $m_i$=0, for i=1, 2, ..., n
  While C≥min{$m_1, m_2, ..., m_n$}, do:
    find the position i such that the entry $\pi_i$ may be the largest subject to $m_i$≤C
    set $m_i$←$m_i$+1
    set $$\pi_i \leftarrow \frac{m_i}{m_i + 1}\pi_i$$

set C←C-$m_i$
  Output: m=[$m_1, m_2, ..., m_n$]

Let t be the assumed number of errors. Following formula 14, an expected number of degrees of freedom may be maximized when the expected score is maximized per formula 55 as follows:

$$E\{N_{free}\} = \frac{(2\deg_{1,w}(Q(x,y))+2-wL_y)(L_y+1)}{2} \leq \tag{55}$$

$$-(t-t_0)L_y^2 + L_y(\lfloor E\{M_m\}\rfloor - t + t_0) + \lfloor E\{M_m\}\rfloor \leq$$

$$-(t-t_0)L_y^2 + L_y(\lfloor \langle m(\pi^{(t)}, C), \pi^{(t)}\rangle \rfloor - t + t_0) + \lfloor m(\pi^{(t)}, C)\pi^{(t)T}\rfloor$$

where "=" in the first "=" may be achieved by choosing the weighted degree of Q(x,y) per formula 56 as follows:

$$\deg_{1,w}(Q(x,y)) = \lfloor E\{M_m\}\rfloor - 1 - (t-L_\Lambda)L_y \tag{56}$$

and "=" in the second "=" may be achieved by maximizing $E\{M_m\}$ per formula 57 as follows:

$$E\{Mm\} = \langle m(\pi^{(t)}, C), \pi^{(t)}\rangle \tag{57}$$

Overall, $E\{N_{free}\}$ is generally maximized by choosing the weighted degree per formula 58 as follows:

$$\deg_{1,w}(Q^*(x,y)) = \lfloor \langle m(\pi^{(t)},C),\pi^{(t)}\rangle\rfloor - 1 - (t-L_\Lambda)L_y \tag{58}$$

Further choosing the degree of y, Ly is generally given by formula 59 as follows:

$$L_y^* = \left\lfloor \frac{\lfloor \langle m(\pi^{(t)}, C), \pi^{(t)}\rangle\rfloor}{2t - 2t_0} \right\rfloor, \tag{59}$$

The expected number of degrees of freedom is generally bounded by formula 60 as follows:

$$E\{N_{free}\} = \tag{60}$$

$$-(t-t_0)\left(\left\lfloor \frac{\lfloor\langle m(\pi^{(t)}, C), \pi^{(t)}\rangle\rfloor}{2t-2t_0}\right\rfloor - \frac{\lfloor\langle m(\pi^{(t)}, C), \pi^{(t)}\rangle\rfloor - (t-t_0)}{2t-2t_0}\right)^2 +$$

$$\frac{(\lfloor\langle m(\pi^{(t)}, C), \pi^{(t)}\rangle\rfloor + t - t_0)^2}{4(t-t_0)} \geq$$

$$-\frac{t-t_0}{4} + \frac{(\lfloor\langle m(\pi^{(t)}, C), \pi^{(t)}\rangle\rfloor + t - t_0)^2}{4(t-t_0)}$$

If the expected number of degrees of freedom is greater than the cost, for example, per formula 61 as follows:

$$\frac{(\lfloor\langle m(\pi^{(t)}, C), \pi^{(t)}\rangle\rfloor + t - t_0)^2}{4(t-t_0)} - \frac{t-t_0}{4} > C \tag{61}$$

The errors may likely be correctable through the rational interpolation following the characterization in formula 52. A more stringent condition may be enforced to boost the correction probability, such that formula 62 is satisfied as follows:

$$\frac{(\lfloor\langle m(\pi^{(t)}, C) - \delta\sigma(\pi^{(t)}, C), \pi^{(t)}\rangle\rfloor + t - t_0)^2}{4(t-t_0)} - \frac{t-t_0}{4} > C \tag{62}$$

where δ≥0 may be a tuning parameter.

In practice, the number of errors t may be substituted with a maximum LECC, denoted by t*, which fulfills formula 61. The parameters L*y and $\deg_{1,w}(Q^*(x,y))$ associated with t* may be used to correct less than t* errors in high probability. By choosing $L^*_y$ and $\deg_{1,w}(Q^*(x,y))$ as in formulae 59 and 58, respectively, corresponding to t*, the constraint $N_{free} > N_{cstr}$ is generally enforced. Therefore, formula 63 as follows:

$$(t-L_\Lambda)L^*_y + \deg_{1,w}(Q^*(x,y)) < m\left\{ m(\pi^{(t^*)}, C), \pi^{(t)}\right\} \tag{63}$$

generally holds for a high probability for any t<t*. For analytical simplicity, all integer precisions may be ignored. Thus, formula 64 may be satisfied as follows:

$$(t-L_\Lambda)L^*_y + \deg_{1,w}(Q^*(x,y)) = (t-L_\Lambda)L^*_y + \langle m(\pi^{(t^*)}, C), \pi^{(t^*)}\rangle - \tag{64}$$

$$1 - (t^* - L_\Lambda)L^*_y$$

$$= (t-t^*)L^*_y + \langle m(\pi^{(t^*)}, C), \pi^{(t^*)}\rangle - 1$$

$$= (t-t^*)\frac{\langle m(\pi^{(t^*)}, C), \pi^{(t^*)}\rangle}{2t^* - 2t_0} +$$

$$\langle m(\pi^{(t^*)}, C), \pi^{(t^*)}\rangle - 1$$

Combining formulae 63 and 64 generally results in formula 65 as follows:

$$\langle m(\pi^{(t^*)}, C), (\pi^{(t^*)} - \pi^{(t)}) \rangle \leq (t^* - t) \frac{\langle m(\pi^{(t^*)}, C), \pi^{(t^*)} \rangle}{2t^* - 2t_0} \quad (65)$$

which yields formula 66 as follows:

$$\frac{\langle m(\pi^{(t^*)}, C), \pi^{(t)} \rangle}{\langle m(\pi^{(t^*)}, C), \pi^{(t^*)} \rangle} = \frac{t^* + t - 2t_0}{2t^* - 2t_0} \quad (66)$$

Assume that formula 67 and 68 are satisfied as follows:

$$E\{\pi^{(t^*)}\} = E\left\{\sum_{i=1}^{n} \pi_i^{(t^*)}\right\} = t^*. \quad (67)$$

$$E\{\pi^{(t)}\} = E\left\{\sum_{i=1}^{n} \pi_i^{(t)}\right\} = t. \quad (68)$$

Further assume that formula 69 is satisfied as follows:

$$\frac{\langle m(\pi^{(t^*)}, C), \pi^{(t)} \rangle}{\langle m(\pi^{(t^*)}, C), \pi^{(t^*)} \rangle} \approx \frac{t}{t^*}. \quad (69)$$

and thus $$\frac{t}{t^*} > \frac{t^* + t - 2t_0}{2t^* - 2t_0}.$$

Therefore, formula 66 may be fulfilled with a high probability. The detailed procedure to determine the desired multiplicity vector is presented as follows.
Inputs: $\pi$, C, $\delta$
For $$t = \left\lfloor \frac{n-k}{2} \right\rfloor + 2, \left\lfloor \frac{n-k}{2} \right\rfloor + 3, \ldots, n-k,$$

do:
Compute $\pi^{(t)}$
Call Iterative Construction of Multiplicity Vector to generate $m(\pi^{(t)}, C)$.
If the validity check of formula 62 is not satisfied, then break.
Set $t^* \leftarrow t-1$ and call Iterative Construction of Multiplicity Vector to generate $m(\pi^{(t^*)}, C)$.
Furthermore, given $L^*_Y$ as defined in formula 59 upon a received word y, the list decoding is generally successful if formula 70 is satisfied as follows:

$$C < N_{free} = \frac{(2deg_{1,w}(Q(x, y)) + 2 - wL_y^*)(L_y^* + 1)}{2} \quad (70)$$

$$= L_y^{*2}(e - t_0) + L_y^*\left(\sum_{c_i \neq y_i} m_i - e + t_0\right) + \sum_{c_i \neq y_i} m_i$$

where e may denote the number of errors, and the degree may be given per formula 71 as follows:

$$deg_{1,w}(Q(x, y)) = \sum_{c_i \neq y_i} m_i - 1 - (e - L_\Lambda)L_y^*. \quad (71)$$

The Chase decoding technique, referred to as a variant of Chase II technique, generally flips all combinations of a set of t symbol error patterns, each time applying bounded-distance decoding, and finally choosing the most likely codeword, if any, among the decoded candidate codewords. The Chase flipping and the Wu list decoding technique may be combined. Let $y=[y_1, y_2, \ldots, y_n]$ be a received channel word. Let $u=[u_1, u_2, \ldots, u_n]$ be the hard-decision vector as defined in formula 43. Let $u'_i$, $i \in I$, be the $\tau(|I|=\tau)$ most reliable secondary channel decisions. Define $\tau$ per formula 72 new error probabilities as follows:

$$\overline{\pi}_i = Pr(x \neq u_i, x \neq u'_i | Y = y_i) = \frac{\sum_{x \neq u_i, x \neq u'_i} f(y_i | x)}{\sum_{x \in F_q} f(y_i | x)}, \text{ for } i \in I \quad (72)$$

Let $m=[m_1, m_2, \ldots, m_n]$ be a multiplicity vector for all $2^\tau$ combinatorial list decoding attempts. Hence, a probability of failure may be similar to a single list decoding with the multiplicity vector m over the new vector of symbol error probabilities $\{\pi'_i\}_{i \in I} \cup \{\pi_j\}_{j \in \bar{I}}$.

Given a symbol error probability vector p, the multiplicity vector m, as well as the associated y-degree $L_y$, by formula 55, the number of degrees of freedom may be expressed by formula 73 as follows:

$$-(t - t_0)L_y^2 + L_y\left(\sum_{i=1}^{n} M_i - t + t_0\right) + \sum_{i=1}^{n} M_i \quad (73)$$

where t may denote an assumed number of errors and $M_i$ may be defined in formula 48. The failure probability of the list decoding technique, $P_e$, is generally governed by a single threshold per formula 74 as follows:

$$P_e = Pr\left(\sum_{i=1}^{n} M_i < \frac{\frac{1}{2}\sum_{i=1}^{n} m_i(m_i + 1) + (t - t_0)(L_y^2 + L_y)}{L_y + 1}\right) \quad (74)$$

Define $\tau$ secondary error probabilities per formula 75 as follows:

$$\hat{\pi}_i = Pr(x \neq u'_i | Y = y_i) = \frac{\sum_{x \neq u'_i} f(y_i | x)}{\sum_{x \in F_q} f(y_i | x)}, \text{ for } i \in I \quad (75)$$

and the corresponding binomial distributions per formula 76 as follows:

$$\begin{cases} P(\hat{M}_i = m_i) = \hat{\pi}_i^{(t)} \\ P(\hat{M}_i = 0) = 1 - \hat{\pi}_i^{(t)} \end{cases}, \text{ for } i \in I \quad (76)$$

Furthermore, define the binomial distributions associated with the combined error probabilities per formula 77 as follows:

$$\begin{cases} P(\overline{M}_i = m_i) = \overline{\pi}_i^{(t)} \\ P(\overline{M}_i = 0) = 1 - \overline{\pi}_i^{(t)} \end{cases}, \text{ for } i \in I \quad (77)$$

The independence of $M'_i$ and $M_i$, $i \in I$, in conjunction with formula 72 generally indicates that formula 78 is satisfied as follows:

$$P(M'_i) = P(M'_i \cup M_i), i \in I \quad (78)$$

The decomposition formula 79 may conclude as follows:

$$Pr\left(\sum_{i \in I} \overline{\pi}_i + \sum_{i \neq I} \pi_i\right) = Pr\left(\sum_{i \in I} \hat{\pi}_i \cup \pi_i + \sum_{i \neq I} \pi_i\right) \quad (79)$$

$$= \sum_{I_1 \subseteq I} Pr\left(\sum_{i \in I_1} \hat{\pi}_i + \sum_{j \in I/I_1} \pi_j + \sum_{i \neq I} \pi_i\right)$$

With $\tau$ merged symbol decisions, the elements of $\pi$ may no longer be similar and independently distributed. Therefore, an approximation may be made to ignore the differences. Furthermore, half of the $\tau$ second reliable symbols may be correct given that there are at least $(d-1)/2$ errors due to hard-decision decoding failure. Thus, the error probabilities may be closely approximated by conditioning on an error rate of $(t+\tau/2)n$ per formulae 80 and 81 as follows:

$$\pi_i^{(t)} = Pr\left(x \neq u_i \mid Y = y_i, E = \frac{t+\tau/2}{n}\right) \quad (80)$$

$$= \frac{\frac{(t+\tau/2)/n}{Pr(x \neq u_i \mid x)} \sum_{x \neq u_i} f(y_i \mid x)}{\frac{(t+\tau/2)/n}{Pr(x \neq u_i \mid x)} \sum_{x \neq u_i} f(y_i \mid x) + \frac{(n-t-\tau/2)/n}{Pr(x = u_i \mid x)} f(y_i \mid u_i = x)}, \text{ for } i \in I$$

$$\pi_i^{(t)} = Pr\left(x \neq u_i, x \neq u'_i \mid Y = y_i, E = \frac{t+\tau/2}{n}\right) \quad (81)$$

$$= \frac{\frac{(t+\tau/2)/n}{Pr(x \neq u_i, x \neq u'_i \mid x)} \sum_{x \neq u_i, x \neq u'_i} f(y_i \mid x)}{\frac{(t+\tau/2)/n}{Pr(x \neq u_i, x \neq u'_i \mid x)} \sum_{x \neq u_i, x \neq u'_i} f(y_i \mid x) + \frac{(n-t-\tau/2)/n}{Pr(x = u_i \text{ or } x = u'_i \mid x)} \sum_{x \neq u_i, x \neq u'_i} f(y_i \mid u_i = x \text{ or } u'_i = x)}$$

for $i \in I$.

The subsequent adjustment (or optimization) of the multiplicity vector m generally follows. Without applying Chase flipping, the symbols generally suffer large error probabilities, thus may be assign large multiplicities. Using Chase exhaustive flipping essentially merges multiple (e.g., two) most reliable channel estimations into a unified estimation with almost a twice higher reliability. Thus, low multiplicities may be instead assigned to the flipping symbols which exhibit near-zero error probabilities.

Figure 8:
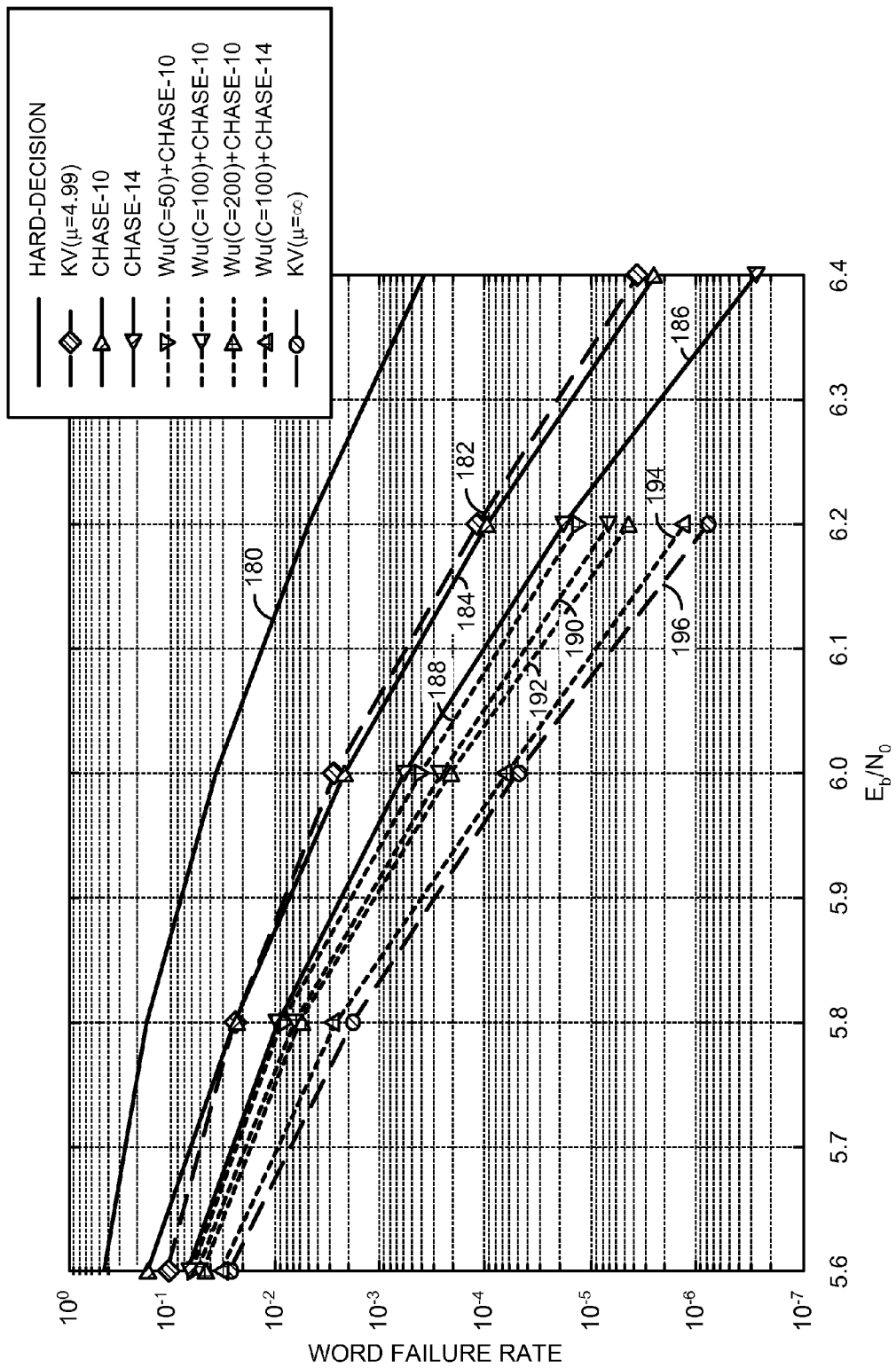
FIG. 8 is a graph of performance comparisons for decoding a (458, 410) Reed-Solomon code under a BPSK modulation.

Referring to FIG. 8, a graph of performance comparisons for decoding an (458, 410) Reed-Solomon code over $F_2^{10}$ under a BPSK modulation is shown. The simulation results may be based on the decoding performance of RS/BCH codes over an additive white Gaussian noise (e.g., AWGN) channel with either BPSK or QAM as the signal modulation. In the simulations, d may be set to 0.25, which is used to determine the maximum LECC, as given in formula 62. On all performance curves, 100 errors were generally collected for each data point.

Consider the decoding for the (458, 410) Reed-Solomon code over $F_2^{10}$ under a BPSK modulation. A hard-decision decoding may corrects up to 24 errors, see curve 180. A conventional Chase-10 decoding, see curve 184, which systematically flips the 10 most reliable second symbol decisions, may provide a 0.3 dB gain over the hard-decision decoding. A conventional Chase-14 decoding, see curve 186, which uses up to $2^{14}=16384$ hard-decision decodings, may provide an additional 0.1 dB gain. The additional gain of the Chase decoding may be diminishing by flipping more and more of the most reliable second symbol decisions. The Koetter-Vary technique with maximum multiplicity 4 is also simulated, see curve 182, which may exhibit a similar performance as the Chase-10 decoding. Three performance curves of some embodiments of the present invention in combination with the Chase-10 decoding may also be illustrated, see curves 188 to 194. The used cost is generally smaller than code length, which may indicate that most of the locations incur zero multiplicity. Finally, the Wu list decode technique using a cost 100 in combination with the Chase-14 decoding may achieve near that of the infinity-cost Koetter-Vardy technique, see curve 196, and so may be effective.

Figure 9:
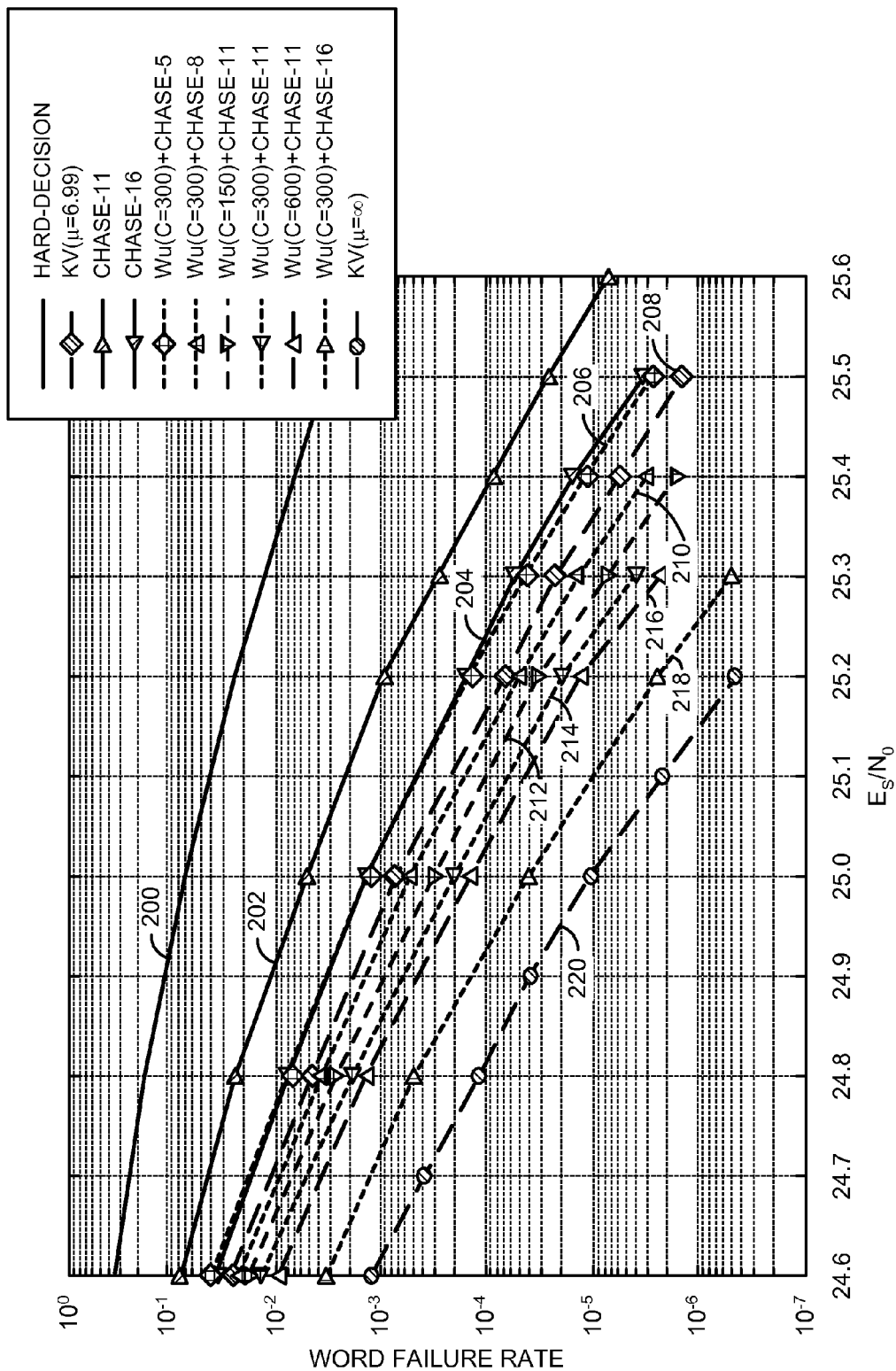
FIG. 9 is a graph of performance comparisons for decoding a (255, 191) Reed-Solomon code under a QAM modulation.

Referring to FIG. 9, a graph of performance comparisons for decoding a (255, 191) Reed-Solomon code over $F_2^8$ under a QAM modulation is shown. The Berlekamp-Massey technique generally corrects up to 32 errors, see curve 200. A Chase-11 decoding with a complexity increased by a factor of $2^{11}=2048$, see curve 202, generally yields a 0.5 dB improvement over the hard-decision decoding. The Chase-16 decoding, see curve 204, which further increases complexity by a factor of $2^5=32$, may achieve an additional 0.15 dB gain. Some embodiments of the present invention with a cost of 300 by combined with the Chase-16 decoding, see curve 218, generally achieves a 0.4 dB gain on top of the Chase-16 decoding, and is about 0.1 dB away from the Koetter-Vardy technique with infinite multiplicity, see curve 220. To demonstrate performance-complexity tradeoff, performance curves are generally illustrated which combine the Wu list decode technique under the same cost C=300 but different number of Chase flipping symbols, t=5, 8, 11, and 16, respectively, and the curves that combine the same Chase-11 decoding and the Wu list decode technique under the different cost, C=150, 300, 600, respectively, see curves 206 to 218. Some embodiments of the Wu list decode technique with a low cost of 150 in combination with Chase-11, see curve 212, generally achieves a 0.7 dB gain over the hard-decision decoding at an implementable complexity.

Figure 10:
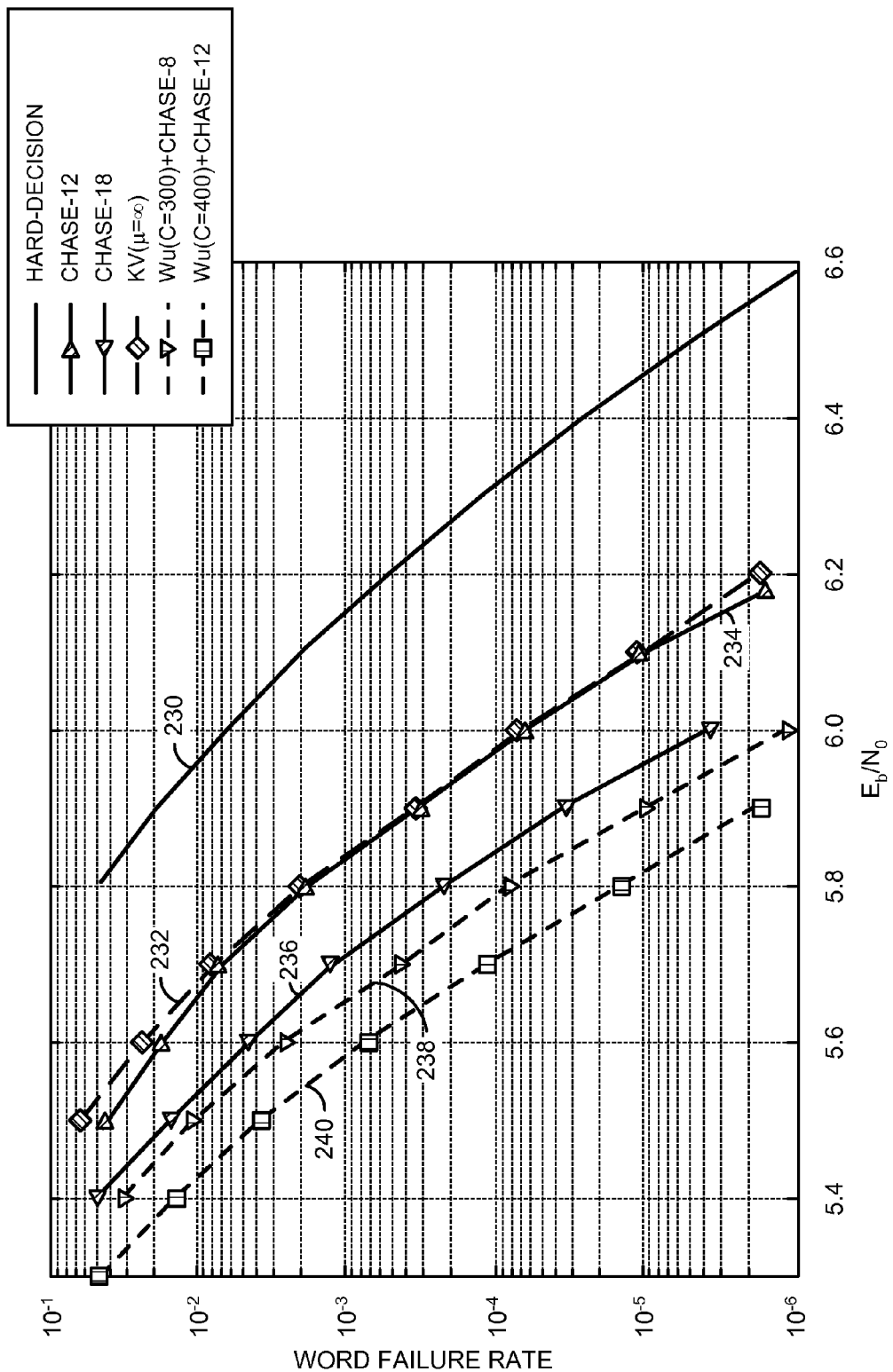
FIG. 10 is a graph of performance comparisons for decoding a (4408, 4096) BCH code under a BPSK modulation.

Referring to FIG. 10, a graph of performance comparisons for decoding a (4408, 4096) BCH code under a BPSK modulation is shown. The BCH code may be used in Flash memories in which errors tend to be random. The Berlekamp technique may correct up to 24 erroneous bits, see curve 230. The Koetter-Vardy technique with infinite multiplicity, see curve 232, generally performs similar to the Chase-12 technique, see curve 234, and achieves about a 0.4 dB gain over the hard-decision decoding at a word-failure-rate of $10^{-5}$. The Chase-18 technique, see curve 236, may obtain about a 0.12 dB gain over the Chase-12 technique at the price of increasing complexity by a factor of $2^6=64$. The gain further generally diminishes by exhaustively flipping more bits. The Wu list decode technique with a mere cost of C=300 together with Chase-8, see curve 238, may achieve a 0.55 dB at a word-failure-rate of $10^{-5}$. The cost may be even smaller than the code redundant length, 312. Furthermore, the Wu list decode technique with a cost of 400 combining with Chase-12 decoding, see curve 240, generally exhibits a gain of more than 0.6 dB over hard-decision decoding at a word-failure-rate of $10^{-5}$.

When some positions are pre-corrected, the Wu list decode technique may adapt to increase the list error correction capability for Reed-Solomon and binary BCH/Goppa codes. For Reed-Solomon codes, when the number of uncertain positions reduces down to the minimum distance d, the corresponding LECC generally enlarges accordingly up to d−1. For binary BCH codes, when the number of uncertain positions reduces down to 2d, the corresponding LECC may enlarge accordingly up to d−1. All codewords with errors confined to 2d−1 erasure bits may be listed for a binary BCH/Goppa code, where d may denote a minimum distance.

The Wu list decoding technique may also be extended to algebraic soft decoding by converting symbol error probabilities into varying multiplicities. During the conversion process, the demand for the number of symbol errors may be replaced by the largest LECC which is correctable in the mean sense.

A combination of the Chase decoding and the algebraic soft decoding may assign unreliable positions to be flipped with low multiplicities whereas unreliable positions not to be flipped are generally assigned with high multiplicities. Simulation results generally indicate that the Wu list decoding technique with a small cost in combination with Chase decoding may achieve gains over the hard-decision decoding at a practically implementable complexity. For example, given a (255, 191) Reed-Solomon code under a QAM modulation, the Wu list decode technique with a low cost of 300 in combination with Chase-16 generally yields a 0.9 dB gain over the hard-decision decoding, which is about 0.1 dB away from the Koetter-Vardy technique with infinite multiplicity. Given a (4408, 4096) BCH code under a BPSK modulation, the Wu list decode technique with a low cost of 300 (which is less than the redundant length) in combination with Chase-8 may achieve a 0.55 dB over hard-decision decoding.

The functions performed by the diagrams of FIGS. 1-5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors of the machine implementation.

The present invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The present invention thus may also include a computer product which may be a storage medium or media and/or a transmission medium or media including instructions which may be used to program a machine to perform one or more processes or methods in accordance with the present invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first circuit configured to generate (i) a plurality of symbols and (ii) a plurality of decision values both in response to detecting an encoded codeword; and
   a second circuit configured to (i) generate a plurality of probabilities to flip one or more of said symbols based on said decision values and (ii) generate a decoded codeword by decoding said symbols using a list decode technique in response to said probabilities.

2. The apparatus according to claim 1, wherein (i) said probabilities are generated using a Chase technique and (ii) said list decoding technique comprises a Wu list decode technique.

3. The apparatus according to claim 1, wherein said encoded codeword comprises one of (i) a Reed-Solomon encoded codeword and (ii) a BCH encoded codeword.

4. The apparatus according to claim 1, wherein said detecting comprises a soft detecting.

5. The apparatus according to claim 1, wherein (i) said decisions comprise a plurality of hard decisions and a plurality of soft decisions and (ii) said probabilities are modified before said decoding by merging two or more of said probabilities of an unreliable position in said symbols.

6. The apparatus according to claim 5, wherein (i) a first of said probabilities corresponds to one of said hard decisions, (ii) a second of said probabilities corresponds to one of said soft decisions and (iii) said merging comprises subtracting said first probability and said second probability from a predetermined value.

7. The apparatus according to claim 1, wherein (i) said second circuit is further configured to adjust a plurality of multiplicities in response to said probabilities and (ii) said list decode technique generates said decoded codeword based on said multiplicities.

8. The apparatus according to claim 7, wherein (i) said second circuit is further configured to interpolate a bivariate polynomial in response to said multiplicities and (ii) said list decode technique generates said decoded codeword based on said bivariate polynomial.

9. The apparatus according to claim 8, wherein said second circuit is further configured to flip one or more of said symbols in response to a constant term of said bivariate polynomial being non-zero.

10. The apparatus according to claim 1, wherein said apparatus is implemented as one or more integrated circuits.

11. A method of cyclic code decoding, comprising the steps of:
    (A) generating (i) a plurality of symbols and (ii) a plurality of decision values both in response to detecting an encoded codeword using a circuit;
    (B) generating a plurality of probabilities to flip one or more of said symbols based on said decision values; and
    (C) generating a decoded codeword by decoding said symbols using a list decode technique in response to said probabilities.

12. The method according to claim 11, wherein (i) said probabilities are generated using a Chase technique and (ii) said list decoding technique comprises a Wu list decode technique.

13. The method according to claim 11, wherein said encoded codeword comprises one of (i) a Reed-Solomon encoded codeword and (ii) a BCH encoded codeword.

14. The method according to claim 11, wherein said detecting comprises a soft detecting.

15. The method according to claim 11, wherein (i) said decisions comprise a plurality of hard decisions and a plurality of soft decisions and (ii) said probabilities are modified before said decoding by merging two or more of said probabilities of an unreliable position in said symbols.

16. The method according to claim 15, wherein (i) a first of said probabilities corresponds to one of said hard decisions, (ii) a second of said probabilities corresponds to one of said soft decisions and (iii) said merging comprises subtracting said first probability and said second probability from a predetermined value.

17. The method according to claim 11, further comprising the step of:
    adjusting a plurality of multiplicities in response to said probabilities, wherein said list decode technique generates said decoded codeword based on said multiplicities.

18. The method according to claim 17, further comprising the step of:
    interpolating a bivariate polynomial in response to said multiplicities, wherein said list decode technique generates said decoded codeword based on said bivariate polynomial.

19. The method according to claim 18, further comprising the step of:
    flipping one or more of said symbols in response to a constant term of said bivariate polynomial being non-zero.

20. An apparatus comprising:
    means for generating (i) a plurality of symbols and (ii) a plurality of decision values both in response to detecting an encoded codeword;
    means for generating a plurality of probabilities to flip one or more of said symbols based on said decision values; and
    means for generating a decoded codeword by decoding said symbols using a list decode technique in response to said probabilities.

* * * * *